United States Patent
Jeong et al.

(10) Patent No.: US 10,026,456 B2
(45) Date of Patent: Jul. 17, 2018

(54) BITLINE POSITIVE BOOST WRITE-ASSIST CIRCUITS FOR MEMORY BIT CELLS EMPLOYING A P-TYPE FIELD-EFFECT TRANSISTOR (PFET) WRITE PORT(S), AND RELATED SYSTEMS AND METHODS

(71) Applicant: QUALCOMM Incorporated, San Diego, CA (US)

(72) Inventors: Jihoon Jeong, Cary, NC (US); Francois Ibrahim Atallah, Raleigh, NC (US); Keith Alan Bowman, Morrisville, NC (US); David Joseph Winston Hansquine, Raleigh, NC (US); Hoan Huu Nguyen, Durham, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/862,579

(22) Filed: Sep. 23, 2015

(65) Prior Publication Data

US 2016/0247557 A1 Aug. 25, 2016

Related U.S. Application Data

(60) Provisional application No. 62/119,763, filed on Feb. 23, 2015.

(51) Int. Cl.
*G11C 11/00* (2006.01)
*G11C 5/14* (2006.01)
(Continued)

(52) U.S. Cl.
CPC .................. *G11C 5/14* (2013.01); *G11C 7/12* (2013.01); *G11C 8/08* (2013.01); *G11C 11/413* (2013.01); *G11C 11/419* (2013.01); *G11C 15/04* (2013.01)

(58) Field of Classification Search
CPC .. G11C 8/08; G11C 7/12; G11C 15/04; G11C 11/413; G11C 11/419
See application file for complete search history.

(56) References Cited

U.S. PATENT DOCUMENTS 4,623,989 A 11/1986 Blake
4,660,177 A 4/1987 O'Connor
(Continued)

FOREIGN PATENT DOCUMENTS

CN 102646442 A 8/2012
WO 2013040066 A1 3/2013

OTHER PUBLICATIONS

International Search Report and Written Opinion for PCT/US2016/016087, dated Apr. 19, 2016, 11 pages.
(Continued)

*Primary Examiner* — Richard Elms
*Assistant Examiner* — Mohammed A Bashar
(74) *Attorney, Agent, or Firm* — W&T/Qualcomm

(57) ABSTRACT

Write-assist circuits for memory bit cells ("bit cells") employing a P-type Field-Effect transistor (PFET) write port(s) are disclosed. Related methods and systems are also disclosed. It has been observed that as node technology is scaled down in size, PFET drive current (i.e., drive strength) exceeds N-type Field-Effect transistor (NFET) drive current for like-dimensioned FETs. In this regard, in one aspect, it is desired to provide bit cells having PFET write ports, as opposed to NFET write ports, to reduce memory write times to the bit cells, and thus improve memory performance. To mitigate a write contention that could otherwise occur when writing data to bit cells, a write-assist circuit provided in the form of positive bitline boost circuit can be employed to strengthen a PFET access transistor in a memory bit cell having a PFET write port(s).

35 Claims, 14 Drawing Sheets

(51) Int. Cl.

| | | |
|---|---|---|
| G11C 11/419 | (2006.01) | |
| G11C 11/413 | (2006.01) | |
| G11C 15/04 | (2006.01) | |
| G11C 7/12 | (2006.01) | |
| G11C 8/08 | (2006.01) | |

(56) References Cited

U.S. PATENT DOCUMENTS

| | | | |
|---|---|---|---|
| 5,453,949 | A | 9/1995 | Wiedmann et al. |
| 5,701,095 | A | 12/1997 | Ohsawa |
| 5,771,190 | A | 6/1998 | Okamura |
| 6,205,068 | B1 | 3/2001 | Yoon |
| 6,285,578 | B1 * | 9/2001 | Huang .............. G11C 11/40615 365/154 |
| 6,341,083 | B1 | 1/2002 | Wong |
| 6,449,202 | B1 | 9/2002 | Akatsu et al. |
| 7,038,962 | B2 | 5/2006 | Yamagami |
| 7,064,584 | B2 | 6/2006 | Bertram et al. |
| 7,164,596 | B1 | 1/2007 | Deng et al. |
| 7,256,621 | B2 | 8/2007 | Lih et al. |
| 7,403,426 | B2 | 7/2008 | Hamzaoglu et al. |
| 7,881,137 | B2 | 2/2011 | Chen et al. |
| 8,427,896 | B1 | 4/2013 | Agarwal et al. |
| 8,488,369 | B2 | 7/2013 | Chandra et al. |
| 8,576,649 | B1 | 11/2013 | Nemati |
| 8,659,972 | B2 | 2/2014 | Phan et al. |
| 9,293,192 | B1 | 3/2016 | Wong |
| 2002/0003244 | A1 | 1/2002 | Tooher et al. |
| 2002/0159312 | A1 | 10/2002 | Kasai et al. |
| 2004/0100810 | A1 | 5/2004 | Towler et al. |
| 2005/0207210 | A1 | 9/2005 | Barth, Jr. et al. |
| 2006/0215441 | A1 | 9/2006 | Matsushige et al. |
| 2006/0262628 | A1 | 11/2006 | Nii et al. |
| 2007/0058419 | A1 | 3/2007 | Khellah et al. |
| 2007/0177419 | A1 | 8/2007 | Sachdev et al. |
| 2007/0206404 | A1 | 9/2007 | Yamagami |
| 2007/0211517 | A1 | 9/2007 | Burnett |
| 2008/0002497 | A1 | 1/2008 | Barth, Jr. et al. |
| 2008/0117665 | A1 | 5/2008 | Abeln et al. |
| 2008/0158939 | A1 | 7/2008 | Chen et al. |
| 2009/0059706 | A1 | 3/2009 | Wong |
| 2011/0122712 | A1 | 5/2011 | Idgunji et al. |
| 2011/0280094 | A1 | 11/2011 | Heymann et al. |
| 2012/0063211 | A1 | 3/2012 | Sharma et al. |
| 2012/0213023 | A1 | 8/2012 | Dawson et al. |
| 2012/0307574 | A1 | 12/2012 | Cheng et al. |
| 2013/0094308 | A1 | 4/2013 | Yang |
| 2013/0235679 | A1 | 9/2013 | Devulapalli |
| 2013/0286717 | A1 | 10/2013 | Adams et al. |
| 2014/0003160 | A1 | 1/2014 | Trivedi et al. |
| 2014/0050012 | A1 | 2/2014 | Guillemenet et al. |
| 2014/0151811 | A1 | 6/2014 | Liaw |
| 2014/0151812 | A1 | 6/2014 | Liaw |
| 2014/0153322 | A1 | 6/2014 | Liaw |
| 2014/0153323 | A1 | 6/2014 | Liaw |
| 2014/0160871 | A1 | 6/2014 | Zimmer et al. |
| 2014/0204657 | A1 | 7/2014 | Dally |
| 2014/0204687 | A1 * | 7/2014 | Sinangil .................. G11C 29/52 365/189.11 |
| 2014/0269018 | A1 | 9/2014 | Jin et al. |
| 2015/0009751 | A1 | 1/2015 | Kulkarni et al. |
| 2015/0085568 | A1 | 3/2015 | Gulati et al. |
| 2015/0091609 | A1 | 4/2015 | Srinath et al. |
| 2015/0162058 | A1 | 6/2015 | Joshi |
| 2015/0194208 | A1 | 7/2015 | Nagle et al. |
| 2016/0188889 | A1 | 6/2016 | Narendra Trivedi et al. |
| 2016/0247556 | A1 | 8/2016 | Jeong et al. |
| 2016/0247558 | A1 | 8/2016 | Jeong et al. |
| 2016/0247559 | A1 | 8/2016 | Atallah et al. |
| 2017/0243637 | A1 | 8/2017 | Kulkarni et al. |
| 2017/0316838 | A1 | 11/2017 | Atallah et al. |
| 2018/0033465 | A1 | 2/2018 | Jeong et al. |

OTHER PUBLICATIONS

Second Written Opinion for PCT/US2016/016087, dated Feb. 2, 2017, 6 pages.

International Preliminary Report on Patentability for PCT/US2016/016087, dated May 9, 2017, 30 pages.

Cheng, K., et al., "A Highly Scaled, High Performance 45nm Bulk Logic CMOS Technology with 0.242 $\mu m^2$ SRAM Cell," IEDM 2007, IEEE International Electron Devices Meeting, Washington, DC, 2007, pp. 243-246.

Chik, R. Y. V., "Design Techniques for Low-Voltage BiCMOS Digital Circuits," Dissertation, Dec. 31, 1996, 127 pages.

Diaz, C. H., et al., "32nm Gate-First High-k/Metal-Gate Technology for High Performance Low Power Applications," IEDM 2008, IEEE International Electron Devices Meeting, San Francisco, CA, 2008, pp. 1-4.

Fung, Samuel K. H., et al., "65 nm CMOS High Speed, General Purpose and Low Power Transistor Technology for High Volume Foundry Application," 2004 Symposium on VLSI Technology, Digest of Technical Papers, IEEE, Jun. 15-17, 2004, pp. 92-93.

Jeong, J., et al, "A 16nm Configurable Pass-Gate Bit-Cell Register File for Quantifying the VMIN Advantage of NFET versus PFET Pass-Gate Bit Cells," to be published in Proceedings of the IEEE Custom Integrated Circuits Conference (CICC), Sep. 2015, 4 pages.

Wu, C. C., et al., "A 90-nm CMOS Device Technology with High-speed, General-purpose, and Low-leakage Transistors for System on Chip Applications," IEDM '02, International Electron Devices Meeting, San Francisco, CA, Dec. 8-11, 2002, pp. 65-68.

Wu, C.C., et al., "High Performance 22/20nm FinFET CMOS Devices with Advanced High-K/Metal Gate Scheme," 2010 IEEE International Electron Devices Meeting (IEDM), San Francisco, CA, Dec. 6-8, 2010, pp. 27.1.1-27.1.4.

Wu, S-Y., et al., "A 16nm FinFET CMOS Technology for Mobile SoC and Computing Applications," 2013 IEEE International Electron Devices Meeting (IEDM), Dec. 9-11, 2013, Washington, DC, pp. 9.1.1-9.1.4.

Young, K. K., et al., "A 0.13 $\mu m$ CMOS Technology with 193 nm Lithography and Cu/Low-k for High Performance Applications," 2000 International Electron Devices Meeting, IEDM Technical Digest, Dec. 10-13, 2000, pp. 23.2.1-23.2.4.

Zhu, Zheng, "High Performance CMOS Digital Circuit Design," Dissertation, 1998, 142 pages.

\* cited by examiner

BITLINE POSITIVE BOOST WRITE-ASSIST CIRCUITS FOR MEMORY BIT CELLS EMPLOYING A P-TYPE FIELD-EFFECT TRANSISTOR (PFET) WRITE PORT(S), AND RELATED SYSTEMS AND METHODS

PRIORITY APPLICATION

The present application claims priority under 35 U.S.C. § 119(e) to U.S. Provisional Patent Application Ser. No. 62/119,763 filed on Feb. 23, 2015 and entitled "WRITE-ASSIST CIRCUITS FOR MEMORY BIT CELLS EMPLOYING A P-TYPE FIELD-EFFECT TRANSISTOR (PFET) WRITE PORT(S), AND RELATED SYSTEMS AND METHODS," which is incorporated herein by reference in its entirety.

BACKGROUND

I. Field of the Disclosure

The technology of the disclosure relates generally to memory systems employing addressable static memory bit cells for reading and writing data, and more particularly to write-assist circuits for mitigating write contention conditions when writing to bit cells.

II. Background

Supply voltage (i.e., Vdd) scaling is an effective technique for maximizing processor energy efficiency across all market segments, ranging from small, embedded cores in a system-on-a-chip (SoC) to large multicore servers. As supply voltage in processor-based systems is reduced to conserve power, circuit delay sensitivity to parameter variations amplifies, eventually resulting in circuit failures. These circuit failures limit the minimum operating supply voltage and the maximum energy efficiency of processor-based systems. In current processor-based system designs, static random-access memory (SRAM) caches and/or register files can limit the minimum operation supply voltage. SRAM caches and register file bit cells employ near minimum-sized transistors to maximize capacity. Since uncorrelated parameter variations (e.g., random-dopant fluctuations, line-edge roughness) are inversely proportional to the square-root of the transistor gate area, wide differences exist for the memory bit cell minimum operating voltage to read, write, and retain data.

In this regard, FIG. 1 is a schematic diagram of an exemplary SRAM system 100 employing memory bit cells 102(0)(0)-102(M)(N) ("bit cells 102(0)(0)-102(M)(N)") for storing data in a data array 104. The data array 104 is organized as having 'N+1' bit cell columns and 'M+1' bit cell rows of bit cells 102 supporting an "N+1" bit wide data word. A bitline driver 112(0)-112(N) is provided for each bit cell column 0-N to drive a selected bitline 114(0)-114(N) and a complement bitline (bitline_b) 114'(0)-114' (N) for read and write operations. A wordline driver 108(0)-108(M) is provided for each bit cell row 0-M in the data array 104 to control access to the addressed bit cells 102( )(0)-102( )(N) in a given bit cell row 0-M based on an index(0)-index (M) decoded from a memory address indicating the bit cell row 0-M to be selected. A clock signal (clk) 110 controls the timing of asserting an activated wordline 106(0)-106(M) to access a row of bit cells 102( )(0)-102( )(N) in the selected bit cell row 0-M. In a write operation, data bits 0-N to be written are provided to respective bitline drivers 112(0)-112 (N) to drive the received data bits 0-N and their complement data bits onto the bitlines 114(0)-114(N) and complement bitlines 114' (0)-114' (N), respectively. The wordline driver 108(0)-108(M) for the selected bit cell row 0-M is activated to select the memory bit cells 102( )(0)-102( )(N) to be written. The data bits 0-N asserted on the bitlines 114(0)-114(N) and complement bitlines 114' (0)-114' (N), respectively, are written into the selected memory bit cells 102( )(0)-102( )(N).

FIG. 2 is a circuit diagram of a bit cell 102 in the SRAM system 100 in FIG. 1. In this example, the bit cell 102 is a standard six (6) transistor (6-T) static complement memory bit cell. The bit cell 102 comprises two (2) cross-coupled inverters 120(0), 120(1) powered by voltage (Vdd). The cross-coupled inverters 120(0), 120(1) reinforce each other to retain data in the form of a voltage on a respective true storage node (T) 122 and a complement storage node (C) 122'. Each inverter 120(0), 120(1) is comprised of a respective pull-up P-type Field-Effect transistor (PFET) 124(0), 124(1) coupled in series to a respective pull-down N-type Field-Effect transistor (NFET) 126(0), 126(1). NFET access transistors 128(0), 128(1) are coupled to the respective inverters 120(0), 120(1) to provide respective read/write ports 130(0), 130(1) to the bit cell 102. In a read operation, the bitline 114 and complement bitline 114' are pre-charged to voltage (Vdd). Then, the wordline 106 coupled to gates (G) of the NFET access transistors 128(0), 128(1) is asserted to evaluate the differential voltages on the true storage node 122 and complement storage node 122' to read the bit cell 102. If a logic high voltage level (i.e., a '1') is stored at the true storage node 122 (T=1) and a logic low voltage level (i.e., '0') is stored at the complement storage node 122' (C=0), assertion of the wordline 106 will cause the NFET access transistor 128(1) to discharge the pre-charged voltage on the complement bitline 114' to the complement storage node 122' and through the NFET 126(1) to ground. However, if the NFET access transistor 128(1) is a faster device than the PFET 124(1), the discharge of the pre-charged voltage on the complement bitline 114' can cause a charge build up on complement storage node 122' that can cause inverter 120(0) to flip the voltage on the true storage node 122 from a logic '1' to a logic '0', which may cause a subsequent read operation to the bit cell 102 to return erroneous data. This is known as a read disturb condition.

To mitigate or avoid a read disturb condition from occurring in the bit cell 102 in FIG. 2, the NFET access transistors 128(0), 128(1) could be weakened and the PFETs 124(0), 124(1) in the inverters 120(0), 120(1) be strengthened. However, this can cause write contention issues in the bit cell 102. FIG. 3 is a circuit diagram illustrating a write contention between the NFET access transistor 128(0) and the PFET 124(0) in the inverter 120(0) in the bit cell 102 in FIG. 2. For example, during a write operation, if a logic '1' is stored in the true storage node 122 (T=1) (and a logic '0' is stored in the complement storage node 122' (C=0)), and the data placed on the bitline 114 to be written to the true storage node 122 is a logic '0', the NFET access transistor 128(0) discharges the true storage node 122 to the bitline 114 to write a logic '0' to the true storage node 122. The NFET access transistor 128(0) is capable of passing a strong logic '0'. However, the logic '0' stored in the complement storage node 122' can cause the strengthened PFET 124(0) to overcome the drive strength of the NFET access transistor 128(0) to charge the true storage node 122 to voltage (Vdd) (i.e., a logic '1'), thus causing a write contention on the true storage node 122.

SUMMARY OF THE DISCLOSURE

Aspects of the disclosure involve write-assist circuits for memory bit cells ("bit cells") employing a P-type Field- Effect transistor (PFET) write port(s). Related methods and systems are also disclosed. The bit cells are provided in a data array of a memory system in a processor-based system to store data. It has been observed that as node technology is scaled down in size, PFET drive current (i.e., drive strength) exceeds N-type Field-Effect transistor (NFET) drive current for like-dimensioned FETs. This is due to the introduction of strained silicon in FET fabrication to reduce the effective mass of charge carriers. A write port is a performance critical element in a bit cell. In this regard, in one aspect, it is desired to provide bit cells having PFET write ports, as opposed to NFET write ports, to reduce memory write times to the bit cells, and thus improve memory performance. To mitigate a write contention that could otherwise occur when writing data to bit cells, write-assist circuits are provided for bit cells having a PFET write port(s). By mitigating or avoiding write contention issues in the bit cells, the voltage supply providing the minimum voltage to the bit cells for operation and data retention can be reduced to reduce power consumption and increase processor energy efficiency.

In this regard, in one aspect, a memory system is provided. The memory system comprises a memory bit cell configured to store data in response to a write operation. The memory bit cell comprises one or more PFET access transistors each comprising a gate configured to be activated by a wordline in response to the write operation, and an access node configured to receive data from a bitline. The memory system also comprises a bitline positive boost circuit coupled to the bitline. The bitline positive boost circuit is configured to positively boost a voltage on at least one bitline in response to the write operation.

In another aspect, a memory system is provided. The memory system comprises a means for storing data in response to a write operation. The means for storing data comprises one or more PFET access transistors each comprising a means for being activated by a wordline in response to the write operation, and a means for receiving data from a bitline in response to the write operation. The memory system also comprises a means for positively boosting a voltage on the bitline in response to the write operation.

In another aspect, a method of writing data to a memory bit cell is provided. The method comprises charging a bitline coupled to an access node of one or more PFET access transistors in a memory bit cell with data in response to a write operation. The method also comprises activating a wordline coupled to a gate of the one or more PFET access transistors in response to the write operation to transfer the data from the access node to a storage circuit. The method also comprises positively boosting a voltage on a bitline in response to the write operation to assist transferring the data from the access node to the storage circuit in response to the write operation.

In another aspect, a non-transitory computer-readable medium having stored thereon computer data for an integrated circuit (IC) is provided. The integrated circuit comprises a memory system. The memory system comprises a memory bit cell configured to store data in response to a write operation. The memory bit cell comprises one or more PFET access transistors each comprising a gate configured to be activated by a wordline in response to the write operation, and an access node configured to receive data from a bitline. The memory system also comprises a bitline positive boost circuit coupled to the bitline. The bitline positive boost circuit is configured to positively boost a voltage on at least one bitline in response to the write operation.

DETAILED DESCRIPTION

Figure 1:
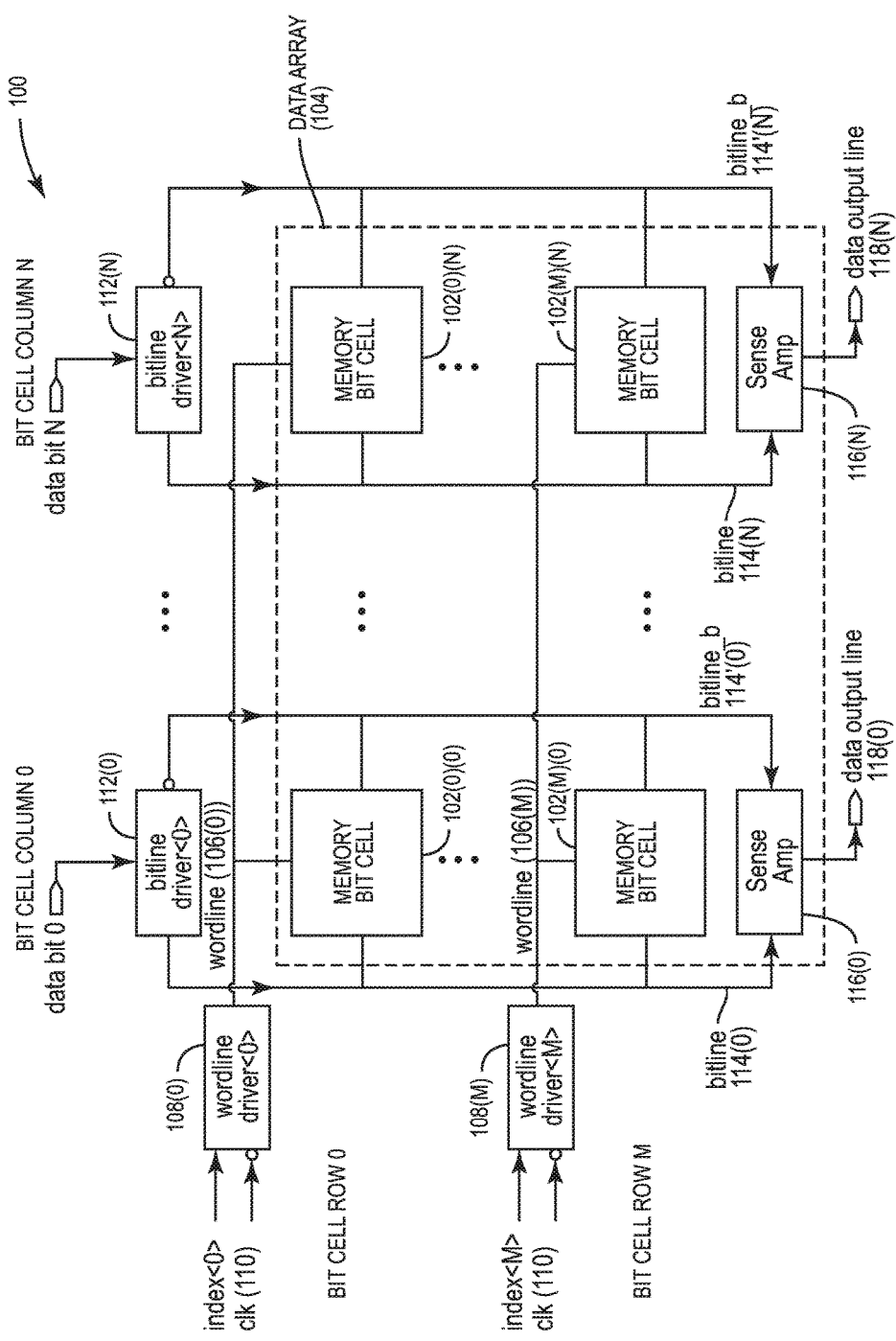
FIG. 1 is a schematic diagram of an exemplary processor-based memory system employing a static random access memory (SRAM) system comprising a data array of static memory bit cells organized in rows and columns for storing data.
Figure 2:
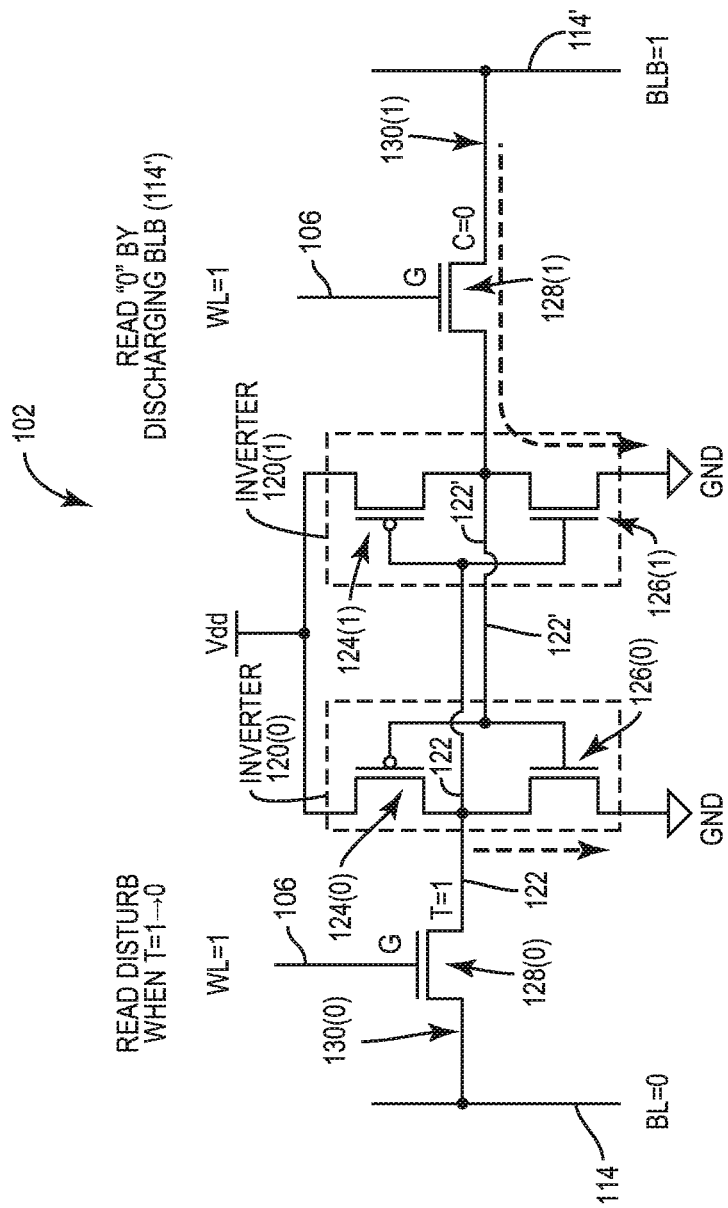
FIG. 2 is a circuit diagram illustrating a read disturb condition in a standard six (6) transistor (6-T) static complement memory bit cell that can be employed in the data array in the SRAM system in FIG. 1.
Figure 3:
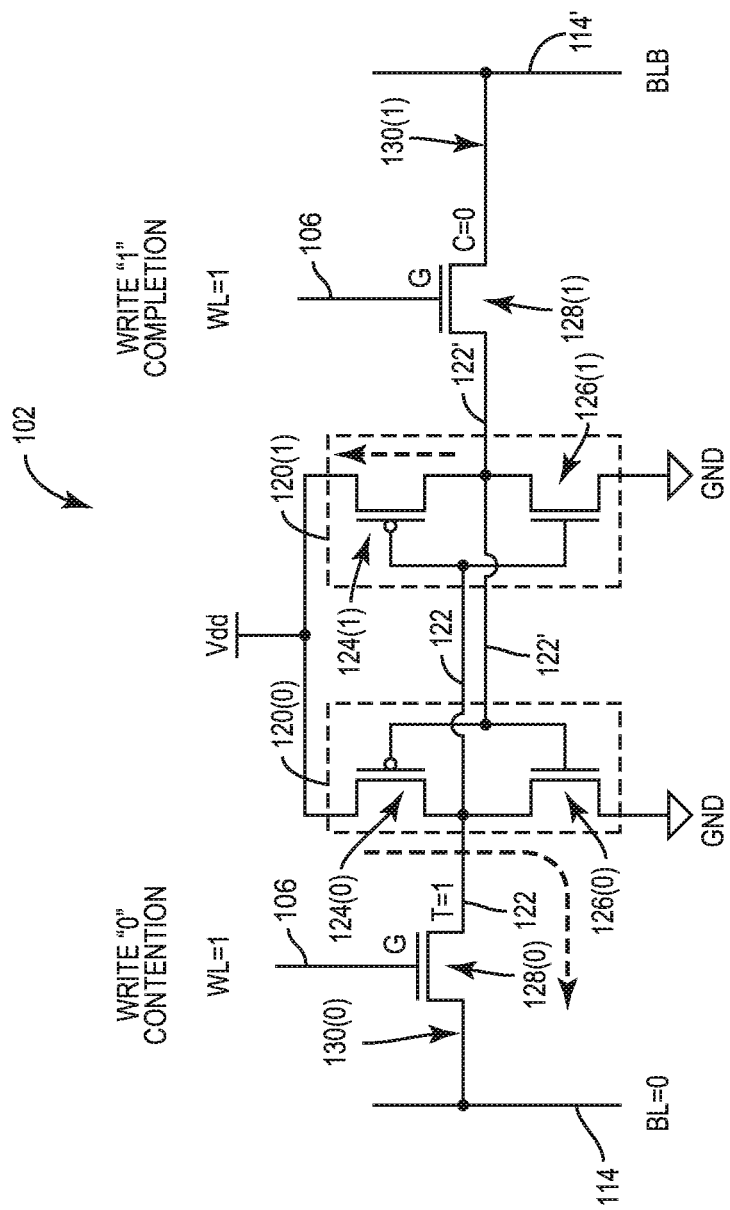
FIG. 3 is a circuit diagram illustrating a write contention between an N-type Field-Effect transistor (NFET) access transistor and an inverter P-type Field-Effect transistor (PFET) in a standard 6-T static complement memory bit cell that can be employed in the data array in the SRAM system in FIG. 1.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 4:
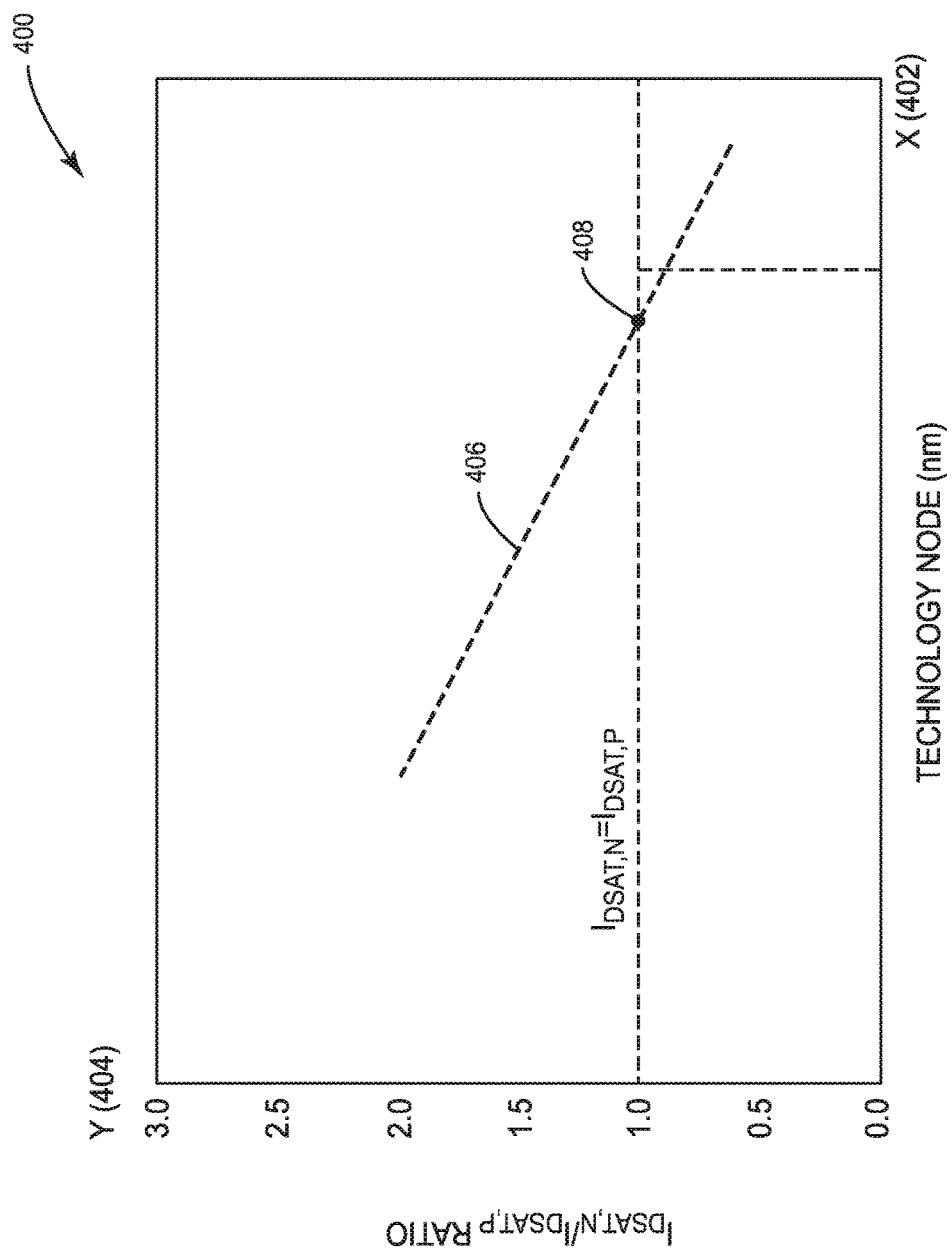
FIG. 4 is a graph illustrating relative saturation drain currents ($I_{DSAT}$) of NFET and PFET technology as a function of technology node size.

Memory bit cells are provided in a data array of a memory system in a processor-based system to store data. As shown in a graph 400 in FIG. 4, it has been observed that as node technology is scaled down in size, P-type Field-Effect Transistor (PFET) drive current (i.e., drive strength) exceeds N-type Field-Effect transistor (NFET) drive current for like-dimensioned FETs. This is due to the introduction of strained silicon in FET fabrication to reduce the effective mass of charge carriers. As illustrated in FIG. 4, the technology node size in nanometers (nm) is provided on an X-axis 402. The ratio of a saturation drain current of a PFET ($I_{DSAT, N}$) of an NFET to the saturation drain current ($I_{DSAT, N}/I_{DSAT, P}$) is provided on a Y-axis 404. The ratio of $I_{DSAT, N}$ to $I_{DSAT, P}$ as a function of technology node size in nm is shown on a ratio line 406. As shown by the ratio line 406 in FIG. 4, a PFET drive strength increases as compared to a like-dimensioned NFET as the technology node size decreases. At point 408, the ratio line 406 crosses a ratio of 1.0 of NFET drive strength to PFET drive strength. Thus, in this example, the drive strength of the PFET is greater than the drive strength of a like-dimensioned NFET.

In this regard, as discussed in more detail below, aspects disclosed herein involve write-assist circuits for memory bit cells ("bit cells") employing a P-type Field-Effect transistor (PFET) write port(s). A write port may be a performance critical element in a bit cell. In this regard, in one aspect, it is desired to provide bit cells having PFET write ports, as opposed to NFET write ports, to increase memory write times to the bit cells, and thus improve memory write performance. As shown in the saturation drive current ($I_{DSAT}$) equation below, an increase in the charge carrier effective mobility results in an increase in drive current ($I_D$).

$$I_D = \tfrac{1}{2}\mu C_{ox} W/L (V_{GS} - V_{TH})^2$$

where:
'µ' is the charge carrier effective mobility,
'W' is the gate width,
'L' is the gate length,
'$C_{ox}$' is the capacitance of the oxide layer;
'$V_{GS}$' is the gate-to-source Voltage, and
'$V_{TH}$' is the threshold voltage.

In this regard, in one aspect, it is desired to provide bit cells having PFET write ports, as opposed to NFET write ports, to reduce memory write times to the bit cells, and thus improve memory performance. To mitigate a write contention that could otherwise occur when writing data to bit cells, write-assist circuits are provided for bit cells having a PFET write port(s). By mitigating or avoiding write contention issues in the bit cells, the voltage supply providing the minimum voltage to the bit cells for operation and data retention can be reduced to reduce power consumption and increase processor energy efficiency.

Figure 5:
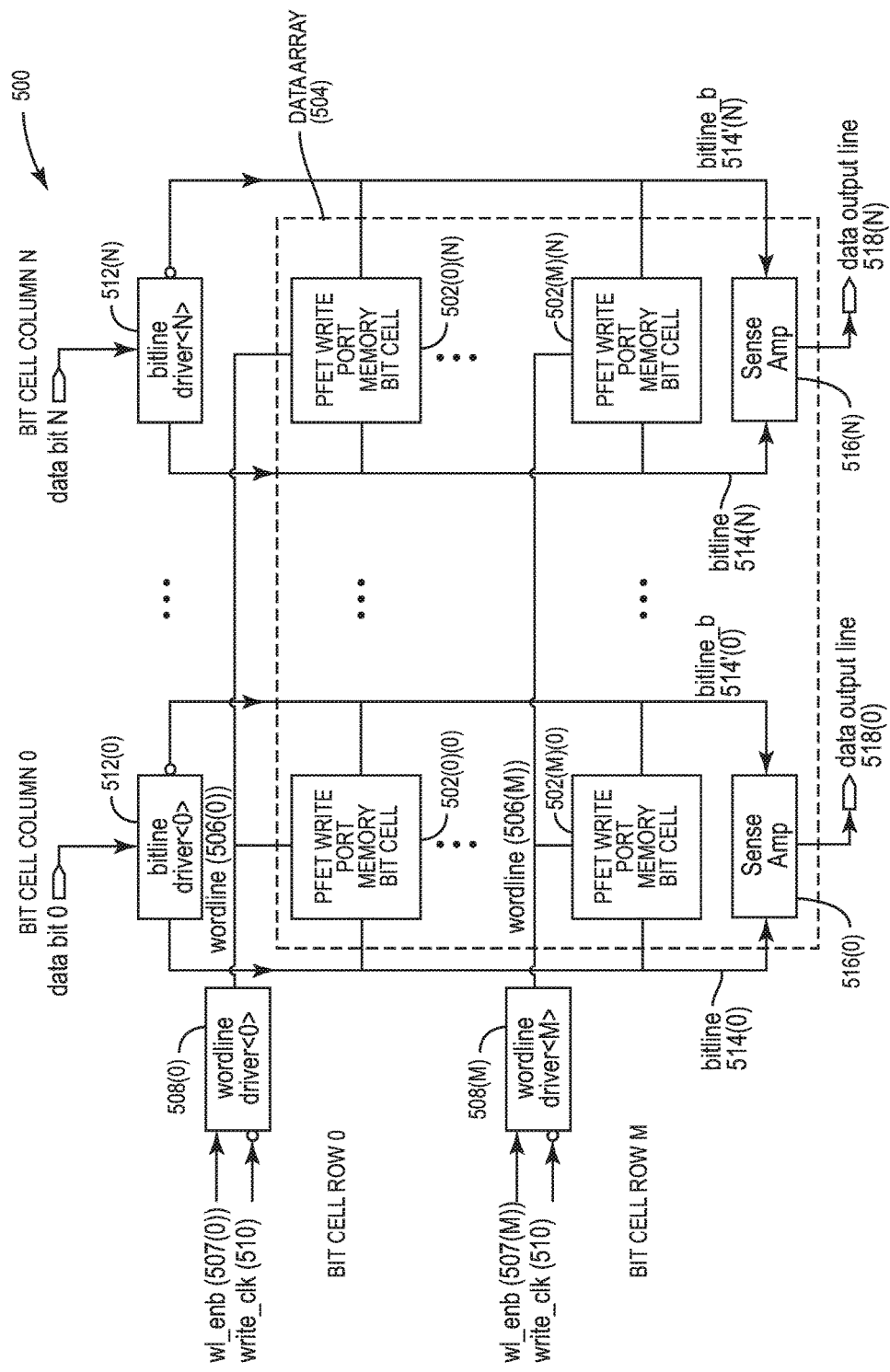
FIG. 5 is a schematic diagram of an exemplary processor-based memory system employing an SRAM system comprising a data array of static memory bit cells employing PFET write ports.

In this regard, FIG. 5 is a schematic diagram of an exemplary SRAM system 500 employing PFET write port bit cells 502(0)(0)-502(M)(N) (also referred to herein as "memory bit cells 502(0)(0)-502(M)(N)"). PFET write port memory bit cells are bit cells that each have one or more PFET write ports. As discussed above, if the technology node of the bit cells 502(0)(0)-502(M)(N) is scaled down far enough, the bit cells 502(0)(0)-502(M)(N) will perform write operations faster than similar bit cells employing NFET write ports. The bit cells 502(0)(0)-502(M)(N) are configured to store data in a data array 504. As non-limiting examples, the bit cells 502(0)(0)-502(M)(N) may be standard six (6) transistor (6-T) or eight transistor (8-T) static complement memory bit cells. The data array 504 is organized as having 'N+1' bit cell columns and 'M+1' bit cell rows of the bit cells 502 supporting an 'N+1' bit wide data word. For any given bit cell row 0-M in the data array 504, each bit cell column 0-N of the data array 504 includes a memory bit cell 502 in which a single data value or bit is stored.

With continuing reference to FIG. 5, write operations to the bit cells 502(0)(0)-502(M)(N) are controlled by respective wordlines 506(0)-506(M) corresponding to each bit cell row 0-M. A memory write operation is performed on the bit cells 502(0)(0)-502(0)(N) in a given bit cell row 0-M based on wordline enable signals (w1_enb) 507(0)-507(M) generated as a result of decoding the memory address in a memory write operation indicating the bit cell row 0-M to be written. The wordline enable signals 507(0)-507(M) may act as wordline enable signals to indicate a write operation. A wordline driver 508(0)-508(M) is provided for each bit cell row 0-M in the data array 504 to control writing to the addressed bit cells 502(0)(0)-502(0)(N) in a given bit cell row 0-M based on the received respective wordline enable signal (w1_enb) 507(0)-507(M). Thus, only one wordline driver 508(0)-508(M) is activated at a time in this example. A write clock signal (write_clk) 510 controls the timing of asserting the activated wordline 506(0)-506(M) to data to the bit cells 502(0)(0)-502(0)(N) in the selected bit cell row 0-M in response to a write operation.

With continuing reference to FIG. 5, a bitline driver 512(0)-512(N) is provided for each bit cell column 0-N in the SRAM system 500 for writing data into the bit cells 502(0)(0)-502(0)(N) in the selected bit cell row 0-M. In this regard, the bitline drivers 512(0)-512(N) drive a bitline 514(0)-514(N) and a complement bitline (bitline_b) 514'(0)-514'(N), because the bit cells 502(0)(0)-502(M)(N) employ a complement bitline architecture.

In a write operation, data bits 0-N to be written are provided to respective bitline drivers 512(0)-512(N) to drive the received data bits 0-N and their complement data bits onto the bitlines 514(0)-514(N) and complement bitlines 514'(0)-514'(N), respectively. The wordline driver 508(0)-508(M) for the selected bit cell row 0-M is activated to select the memory bit cells 502(0)(0)-502(0)(N) to be written. The data bits 0-N asserted on the bitlines 514(0)-514(N) and complement bitlines 514'(0)-514'(N), respectively, are written into the selected memory bit cells 502(0)(0)-502(0)(N).

In a read operation, the bitline drivers 512(0)-512(N) pre-discharge the bitlines 514(0)-514(N) and complement bitlines 514'(0)-514'(N) during a pre-discharge stage. The wordline driver 508(0)-508(M) for the selected bit cell row 0-M causes the data stored in the selected bit cells 502O(0)-502O(N) to be asserted onto the bitlines 514(0)-514(N) and complement bitlines 514'(0)-514'(N) to be sensed by sense amplifiers 516(0)-516(N) provided in each bit cell column 0-N. The sense amplifiers 516(0)-516(N) provide the read data bits from the selected bit cells 502O(0)-502O(N) onto respective data output lines 518(0)-518(N).

Figure 6A:
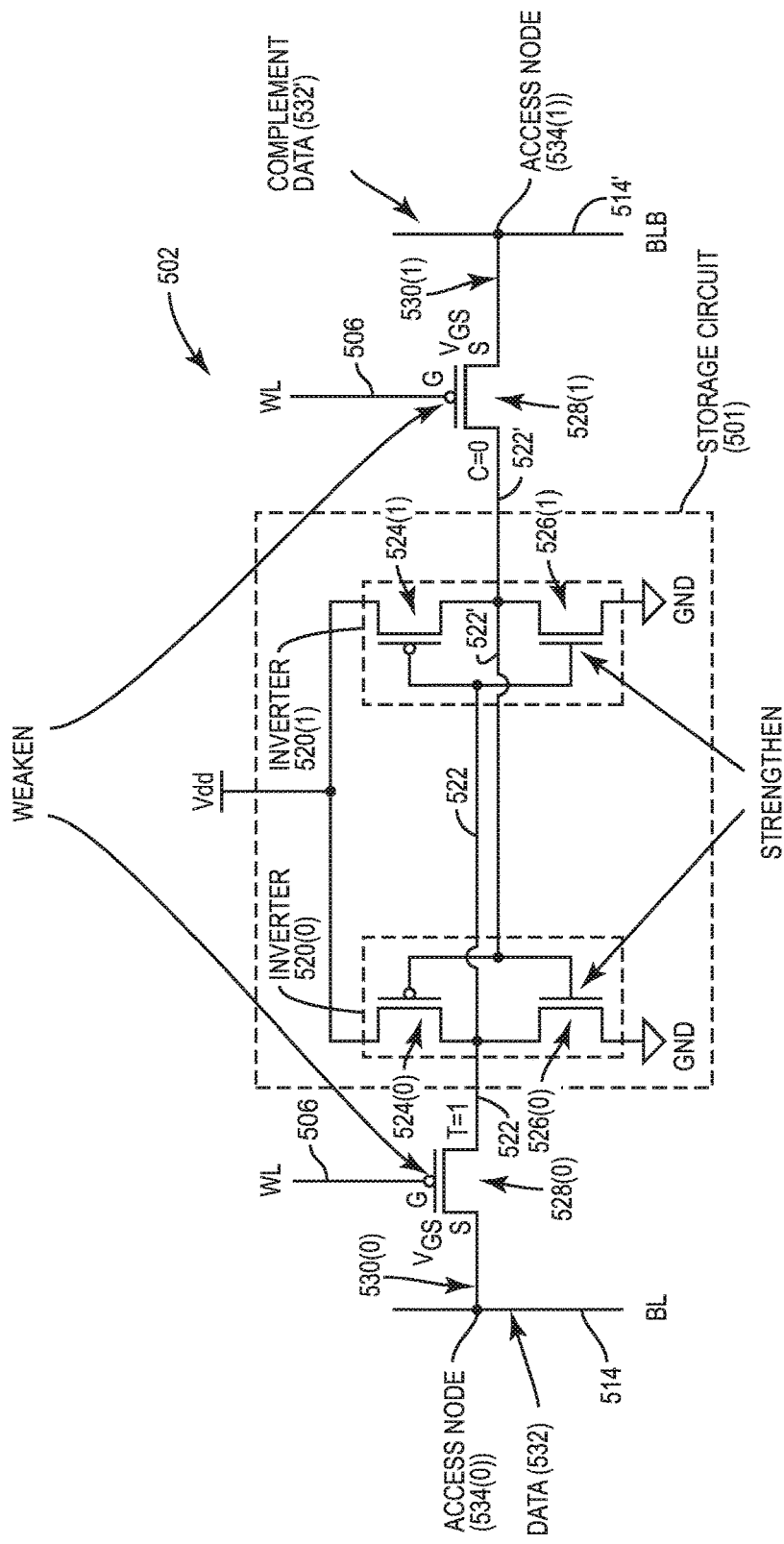
FIG. 6A is a circuit diagram illustrating an exemplary write condition in a standard 6-T static complement bit cell employing a PFET write port in the data array in the SRAM system in FIG. 5.

FIG. 6A is a circuit diagram illustrating a write contention condition in a PFET write port bit cell 502 employing a PFET read/write port in the data array 504 in the SRAM system 500 in FIG. 5. The PFET write port bit cell 502 comprises a storage circuit 501 in this example comprised of two (2) cross-coupled inverters 520(0), 520(1) powered by voltage (Vdd). A true storage node (T) 522 and a complement storage node (C) 522' retain data 532 (i.e., a charge) and complement data 532' (i.e., a complement charge to the data 532) in the form of a voltage on the respective true storage node (T) 522 and complement storage node (C) 522'. Each inverter 520(0), 520(1) is comprised of a respective pull-up PFET 524(0), 524(1) coupled in series to a respective pull-down NFET 526(0), 526(1). Instead of providing NFET access transistors, PFET access transistors 528(0), 528(1) are coupled to the respective inverters 520(0), 520(1) to provide respective read/write ports 530(0), 530(1) to the PFET write port bit cell 502. In a read operation, the bitline 514 and complement bitline 514' are pre-charged to voltage (Vdd). Then, the wordline (WL) 506 coupled to gates nodes (G) (also referred to herein as "gate") of the PFET access transistors 528(0), 528(1) is asserted to evaluate the differential voltages on the true storage node 522 and complement storage node 522' to read the PFET write port bit cell 502.

Figure 6B:
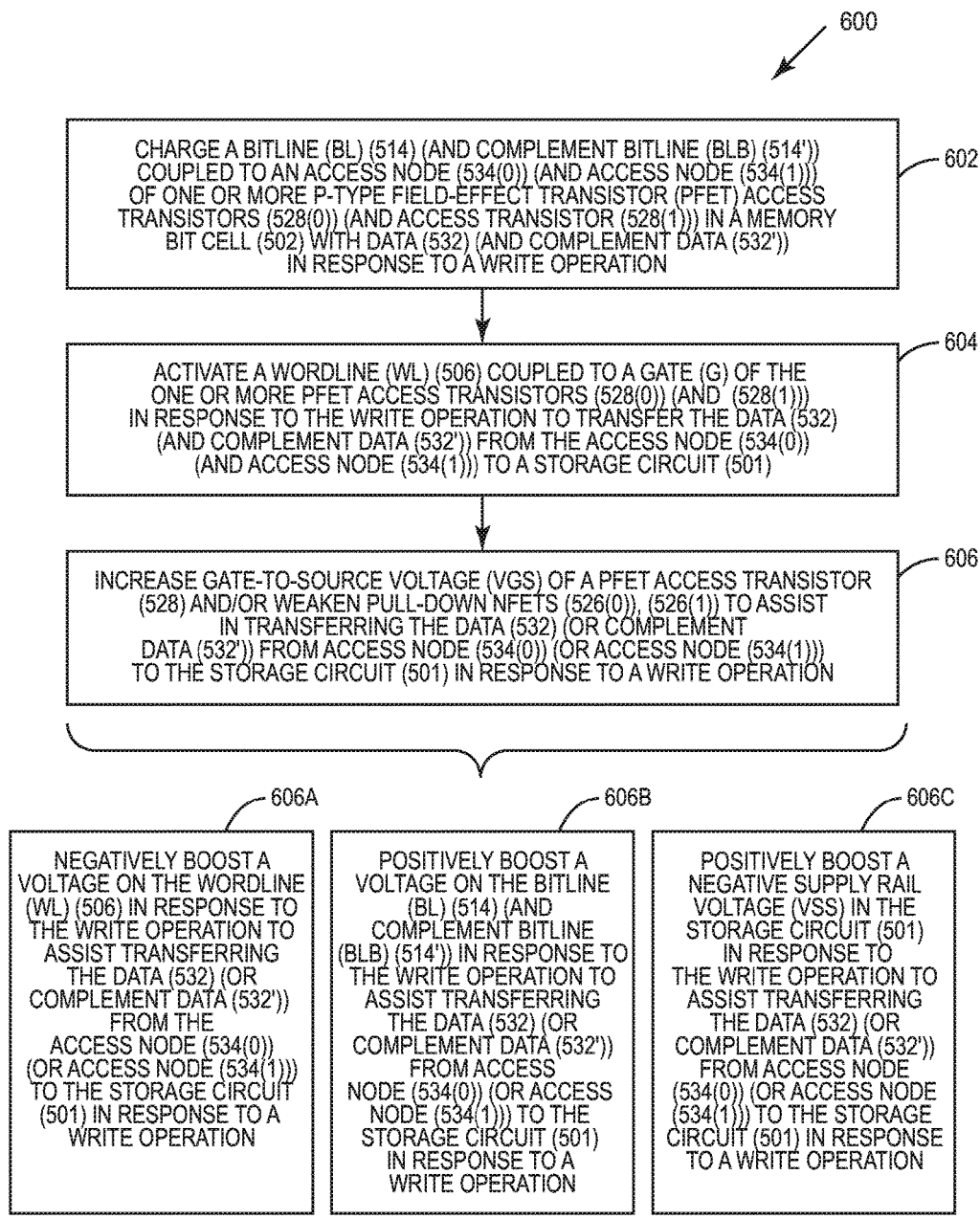
FIG. 6B is a flowchart illustrating exemplary processes for providing write assistance for the memory bit cell including PFET access transistors in FIG. 6A, to avoid write contentions and assist in transferring data into a storage circuit in the bit cell in response to a write operation.

FIG. 6B is a flowchart illustrating an exemplary process 600 for FIG. 6B providing write-assistance for the memory bit cell 502 including the PFET access transistors 528(0), 528(1) in FIG. 6A in response to write operations to avoid write contentions and assist in transferring data 532 and/or complement data 532' into the storage circuit 501. The process 600 in FIG. 6B will be discussed in conjunction with FIG. 6A.

In this regard, in a write operation, the bitline 514 and complement bitline 514' are pre-set to the desired voltage level to represent the logic value to be written as data 532 and complement data 532', respectively, to the storage circuit 501 (block 602 in FIG. 6B). For example, assume that prior to a write operation, a logic '1' is stored in the true storage node 522 (i.e., T=1) (and a logic '0' is stored in the complement storage node 522' (i.e., C=0)). Assume that the data 532 to be written from the bitline 514 to the true storage node 522 is a logic "0." In this regard, a logic '1' is placed on the complement bitline 514' to be written to the complement storage node 522' as the complement data 532'. When the wordline 506 is activated to provide a low voltage (e.g., GND voltage) to a gate (G) of the PFET access transistor 528(0), the PFET access transistor 528(0) will be activated based on the gate (G)-to-source (S) voltage ($V_{GS}$). The PFET access transistor 528(0) passes the data 532 from the bitline 514 coupled to its access node 534(0) to the true storage node 522 to discharge the true storage node 522' with the logic '0' (i.e., lower voltage) from the bitline 514 (block 604 in FIG. 6B). Also, when the wordline 506 is activated to provide a low voltage (e.g., GND voltage) to the gate (G) of the PFET access transistor 528(1), the PFET access transistor 528(1) passes the complement data 532' from its access node 534(1) to the complement storage node 522' to charge the complement storage node 522' with the logic '1' (i.e., higher voltage) from the complement bitline 514' (block 604 in FIG. 6B). The PFET access transistor 528(1) is capable of passing a strong logic '1'. However, at the same time, the pull-down NFET 526(1) is trying to discharge the true storage node 522 to GND. This is because the PFET access transistor 528(0) cannot pass a strong logic '0' to the true storage node 522 to turn off the pull-down NFET 526(1). The pull-down NFET 526(1) will be partially turned on as a result. This causes the PFET access transistor 528(1) and the pull-down NFET 526(1) to be in write contention to write a voltage to the complement storage node 522', either from the complement bitline 514' or GND.

To mitigate or avoid write contentions from occurring in the PFET write port bit cell 502 in FIG. 6A, the PFET access transistors 528(0), 528(1) could be strengthened to increase their gate (G)-to-source (S) ($V_{GS}$) voltage and/or the pull-down NFETs 526(0), 526(1) in the inverters 520(0), 520(1) could be weakened (block 606 in FIG. 6B). In this regard, write-assist circuits can be provided for bit cells employing a PFET write port(s), including the bit cells 502 in the SRAM system 500 in FIG. 5. There are different exemplary write-assist circuits disclosed herein that can be provided for the memory bit cell 502 to mitigate or avoid write contentions in response to write operations without creating read disturb conditions. In this manner, as technology node of the memory bit cell 502 is scaled down, the benefit of the faster read times in the memory bit cell 502 employing the PFET write ports 530(0), 530(1) can be realized while mitigating or avoiding write contention conditions. By mitigating or avoiding write contentions in the memory bit cell 502, the voltage supply providing the minimum voltage (Vdd) to the memory bit cell 502 for operation and data retention can be reduced to reduce power consumption in the SRAM system 500.

Figure 7:
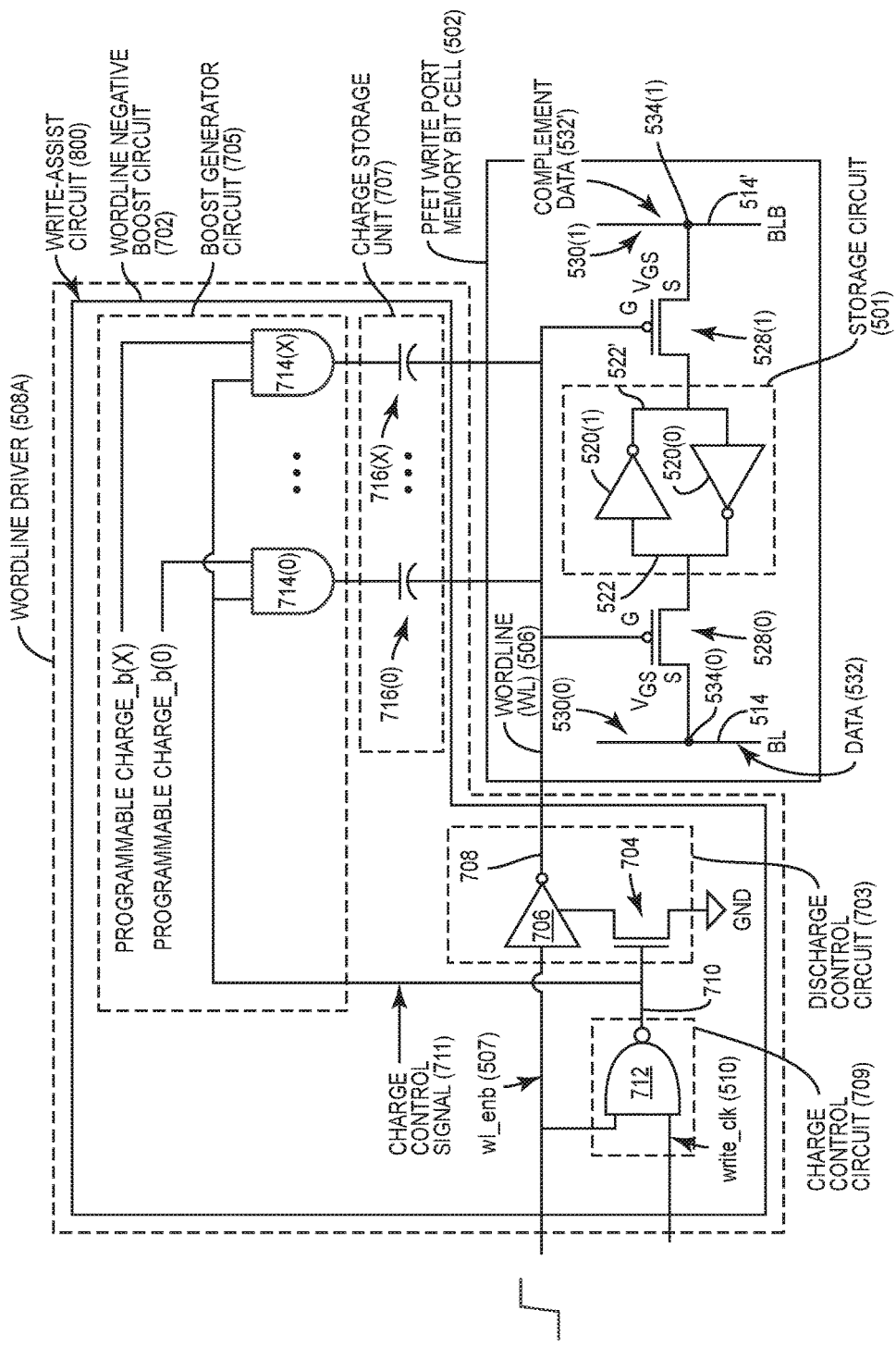
FIG. 7 illustrates an exemplary write-assist circuit that includes a wordline negative boost circuit provided in a wordline driver to negatively boost a wordline of the memory bit cells in FIG. 5 to strengthen PFET access transistors in the memory bit cells in response to a write operation to avoid write contentions.
Figure 8:
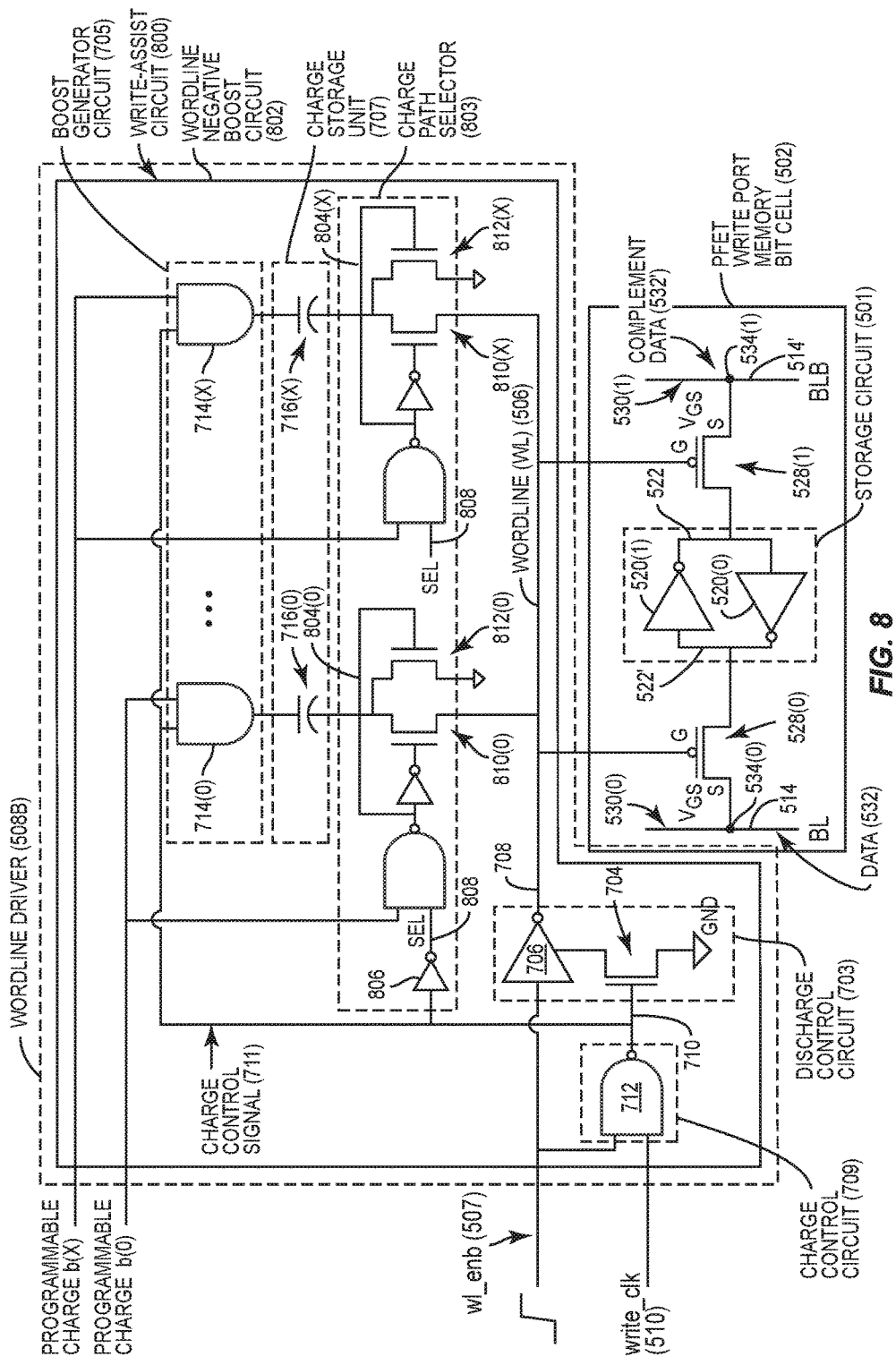
FIG. 8 illustrates another exemplary write-assist circuit that includes a wordline negative boost circuit provided in a wordline driver to negatively boost a wordline of the bit cells in FIG. 5, which additionally includes charge path selection circuits to build a negative boost charge without a charge setup time required and reduced capacitance on the wordline when the write-assist circuit is disabled, to strengthen PFET access transistors in the bit cells in response to a write operation to minimize write contentions.

In this regard, as another example, to mitigate or avoid write contentions in the PFET write port bit cell 502, a write-assist circuit employing a negative wordline boost circuit configured to negatively boost the voltage of the wordline 506 in response to a write operation on the PFET write port bit cell 502 can be employed (block 606A in FIG. 6B). Examples of memory systems that include write-assist circuits employing a negative wordline boost circuit for a PFET write port bit cell are shown in FIGS. 7 and 8, discussed below.

Figure 9:
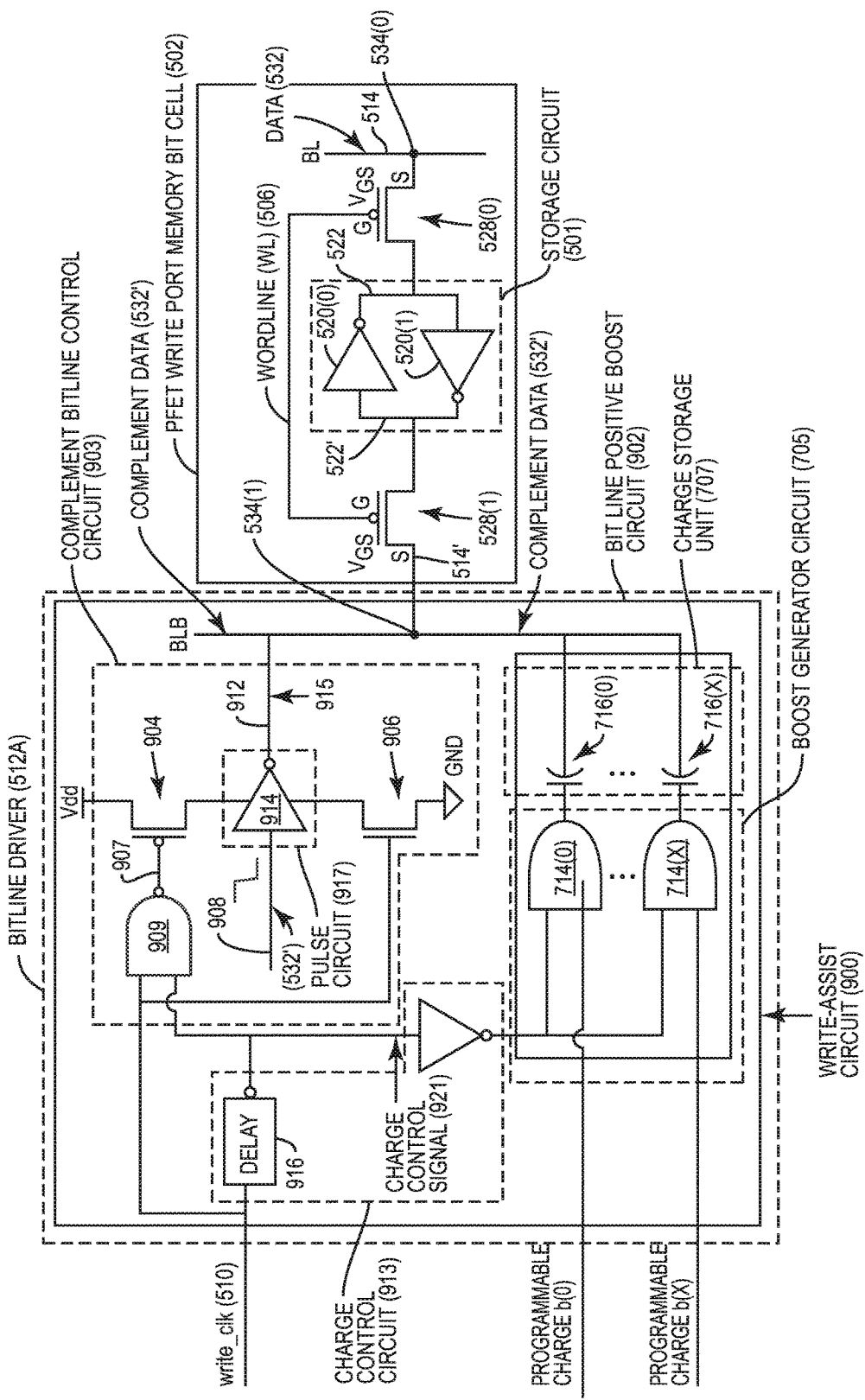
FIG. 9 illustrates an exemplary write-assist circuit that includes a bitline positive boost circuit provided in a bitline driver to positively boost bitlines of the bit cells in FIG. 5 to strengthen PFET access transistors in the bit cells in response to a write operation to avoid write contentions.
Figure 10:
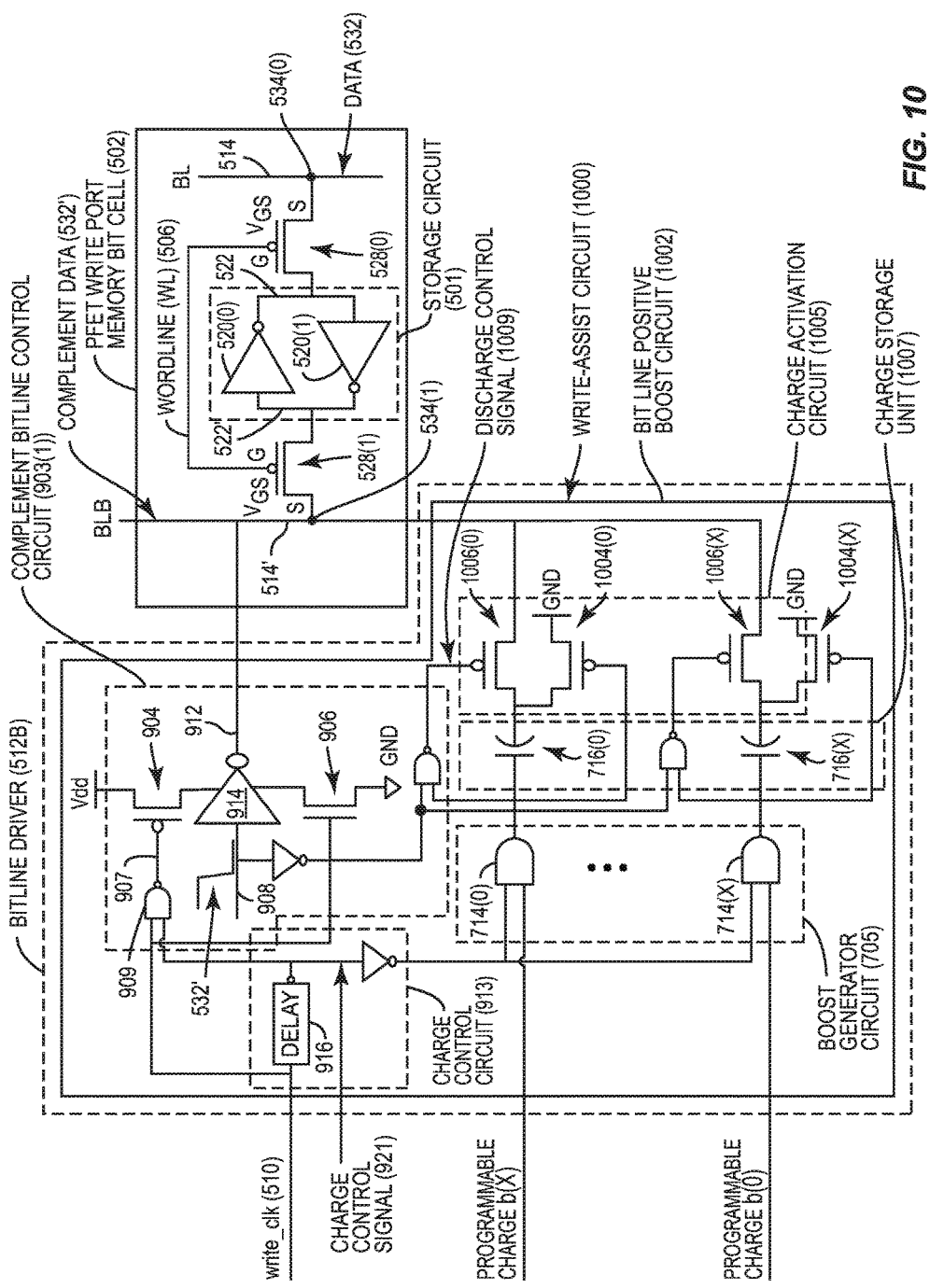
FIG. 10 illustrates another exemplary write-assist circuit that includes a bitline positive boost circuit provided in a bitline driver to positively boost bitlines of the bit cells in FIG. 5 to strengthen PFET access transistors in the bit cells in response to a write operation to avoid write contentions.

Also, as another example to mitigate or avoid write contentions in the PFET write port bit cell 502, a write-assist circuit employing a positive bitline boost circuit configured to positively boost the voltage of the bitline 514 in response to a write operation on the PFET write port bit cell 502 can be employed (block 606B in FIG. 6B). Examples of memory systems that include write-assist circuits employing a positive bitline boost circuit for a PFET write port bit cell are shown in FIGS. 9 and 10 discussed below.

Figure 11:
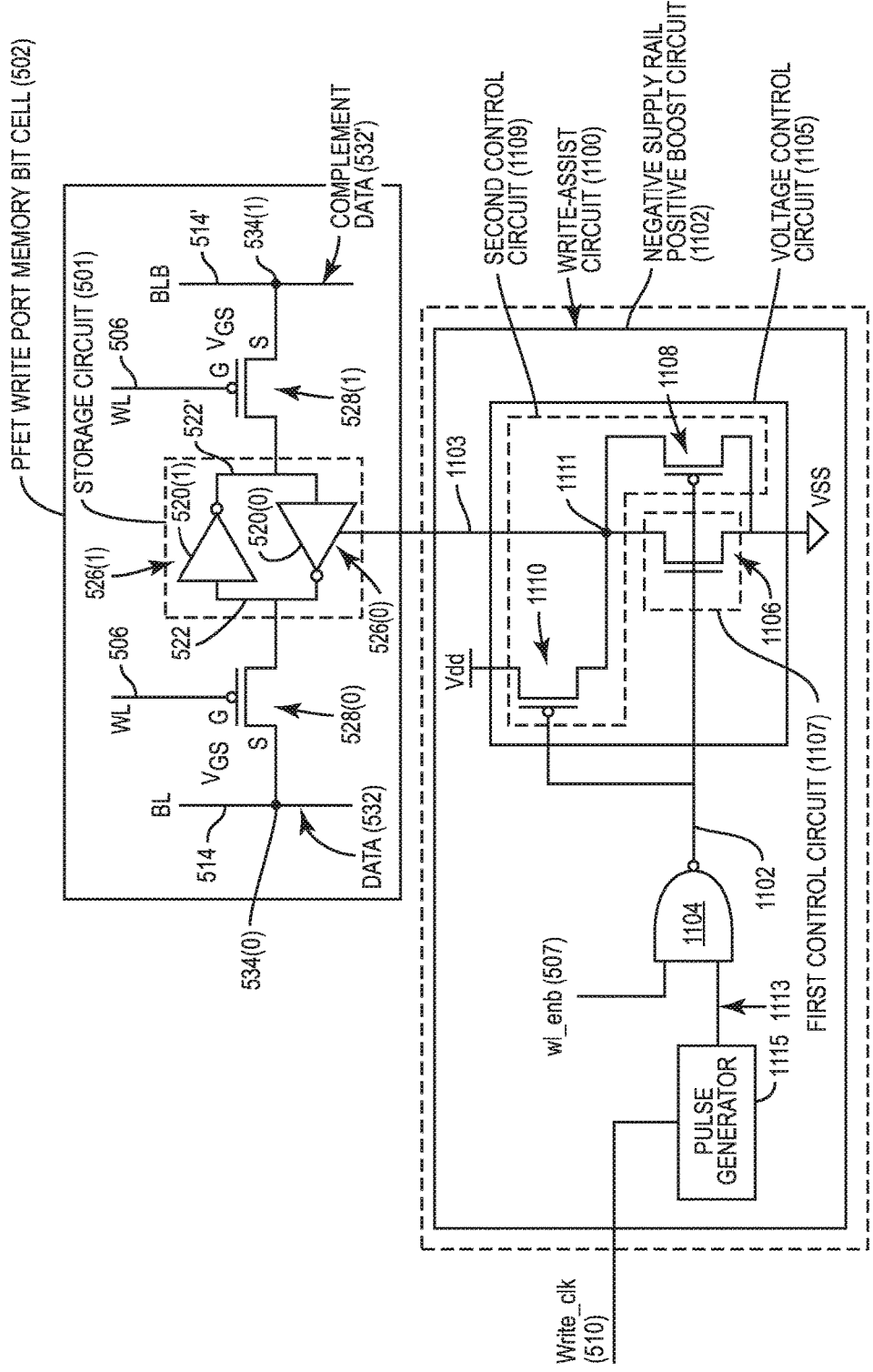
FIG. 11 illustrates an exemplary write-assist circuit that includes an exemplary negative supply rail positive boost circuit configured to weaken an NFET in cross-coupled inverters in the bit cells in FIG. 5 to be weaker than PFET access transistors in the bit cells in response to a write operation to avoid write contentions.
Figure 12:
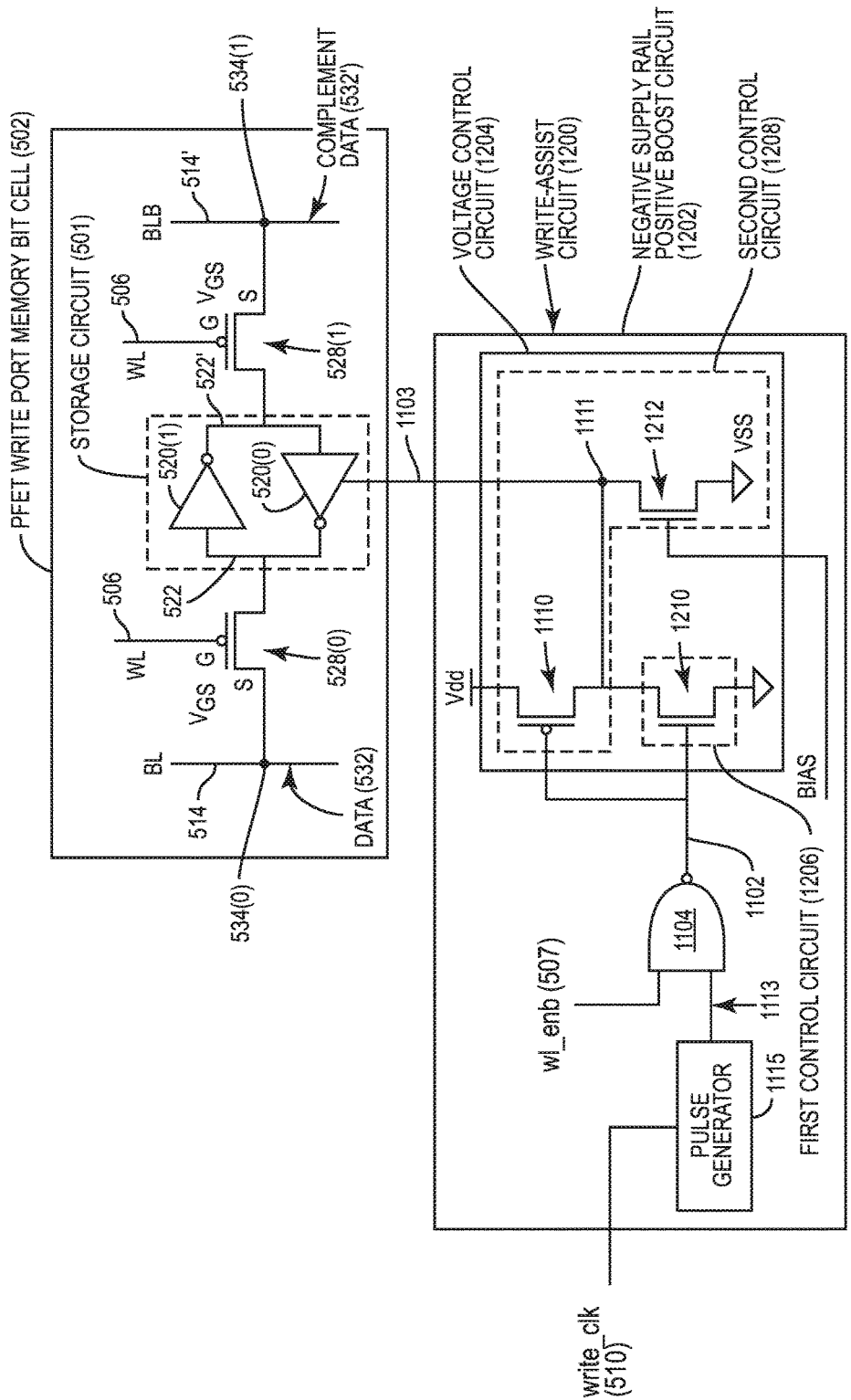
FIG. 12 illustrates another exemplary write-assist circuit that includes another exemplary negative supply rail positive boost circuit configured to weaken an NFET in cross-coupled inverters in the bit cells in FIG. 5 to be weaker than PFET access transistors in the bit cells in response to a write operation to avoid write contentions.

Also, as another example to mitigate or avoid write contentions in the PFET write port bit cell 502, a write-assist circuit employing a negative supply rail positive boost circuit configured to weaken an NFET pull-down transistor in the storage circuit 501 of the PFET write port bit cell 502 in response to a write operation can be employed (block 606C in FIG. 6B). Examples of memory systems that include write-assist circuits employing a negative supply rail positive boost circuit for a PFET write port bit cell are shown in FIGS. 11 and 12 discussed below.

As discussed above, to mitigate or avoid write contentions in the PFET write port bit cell 502, the PFET access transistors 528(0), 528(1) can be strengthened in response to write operations such that the true storage node 522 or complement storage node 522' is not discharged to GND by the respective pull-down NFET 526(0) or 526(1). In this regard, FIG. 7 illustrates an exemplary wordline driver 508A that includes a write-assist circuit 700 in the form of an exemplary wordline negative boost circuit 702 to strengthen the PFET access transistors 528(0), 528(1) in response to a write operation. The wordline negative boost circuit 702 in this example is configured to negatively boost the voltage on the wordline 506 to increase the gate-to-source voltage ($V_{GS}$) of the PFET access transistors 528(0), 528(1) and thus strength the PFET access transistors 528(0), 528(1) in response to write operations. This mitigates or avoids a write contention between the PFET access transistors 528(0), 528(1) and the respective pull-down NFETs 526(0), 526(1) in response to write operations. In this manner, the pull-down NFETs 526(0) or 526(1) do not discharge the true storage node 522 or complement storage node 522' to GND when a logical '1' is being written to the true storage node 522 or complement storage node 522' during a write operation. By negatively boosting the voltage on the wordline 506, the drive current (i.e., drive strength) of the PFET access transistors 528(0), 528(1) is strengthened according to the following saturation drive current equation by increasing gate-to-source voltage ($V_{GS}$), as follows:

$$I_D = \tfrac{1}{2}\mu C_{ox} W/L (V_{GS} - V_{TH})^2$$

where:
$I_D$ is drive current,
'µ' is the charge carrier effective mobility,
'W' is the gate width,
'L' is the gate length,
'$C_{ox}$' is the capacitance of the oxide layer;
'$V_{GS}$' is the gate to source Voltage, and
'$V_{TH}$' is the threshold voltage.

With continuing reference to FIG. 7, to perform a write operation in the memory bit cell 502 in FIG. 7, the wordline 506 is driven to a logical '0' to turn on the PFET access transistors 528(0), 528(1) in the memory bit cell 502. In this regard, the wordline driver 508A in FIG. 7 includes a discharge control circuit 703. The discharge control circuit 703 is provided in the wordline negative boost circuit 702. The wordline negative boost circuit 702 is configured to generate a charge on the wordline (WL) 506 in response to a write operation to negatively boost the gate-to-source voltage (Vgs) of the PFET access transistors 528(0), 528(1). In this regard, the discharge control circuit 703 is configured to place the wordline (WL) 506 in a floating state to prevent a charge storage unit 707 in the wordline negative boost circuit 702 from discharging a charge stored in the charge storage unit 707 onto the wordline (WL) 506 to negatively boost the voltage on the wordline (WL) 506 outside of a write operation. The discharge control circuit 703 in the example in FIG. 7 includes an NFET 704 coupled to ground (GND). When a write operation is not enabled, the wordline enable signal 507 is low or logical '0' in this example. In response, a PFET inside an inverter 706 in the discharge control circuit 703 will be turned on to cause the inverter 706 to generate a logical '1' on an output 708 to drive the wordline 506 to logical '1'. This causes the PFET access transistors 528(0), 528(1) to not be activated.

However, in response to a write operation, the wordline enable signal 507 is initially active without the write clock signal 510 being active. A charge control circuit 709 provided in the boost generator circuit 705 controls charging of the charge storage unit 707 to store a charge, prior to performing a write operation, to later be discharged to negatively boost the voltage on the wordline (WL) 506 in response to a write operation. In this regard, in this example, a charge control circuit 709 is provided to control when the boost generator circuit 705 charges the charge storage unit 707. An output 710 of a NAND gate 712 in the charge control circuit 709 is generated as a charge control signal 711 and is determined to be a logical '1' based on receiving the write clock signal 510 and the wordline enable signal 507. During this time, the logical '1' output 710 from the NAND gate 712 in the charge control circuit 709 will be provided as the charge control signal 711 to a plurality of charge generating circuits 714(0)-714(X) provided in the form of AND gates in this example, in the boost generator circuit 705. Each charge generating circuit 714(0)-714(X) is coupled to the output 710 and a respective programmable charge line b(0)-b(x). Thus, the output 710 is logical '1' for the charge control signal 711 when the index is initially enabled during a read operation, if the respective programmable charge line b(0)-b(x) for the charge generating circuits 714(0)-714(X) is also a logical '1.' The charge generating circuits 714(0)-714(X) will charge respective charge storage circuits 716(0)-716(X) provided in the form of capacitors in this example in the charge storage unit 707. The respective charge storage circuits 716(0)-716(X) will be charged based on the voltage differential between the wordline 506 being driven to GND by the inverter 706 inverting the active wordline enable signal 507 and the output of the charge generating circuits 714(0)-714(X) being Vdd. By providing the plurality of charge generating circuits 714(0)-714(X) in the boost generator circuit 705 of the wordline negative boost circuit 702 that are each programmable via the programmable charge lines b(0)-b(x), the amount of charge stored in the charge storage unit 707 to be discharged in response to a write operation to negatively boost the wordline (WL) 506 can be programmable.

With continuing reference to FIG. 7, when the write clock signal 510 transitions to a high signal (logical '0'), the output 710 of the NAND gate 712 in the charge control circuit 709 will transition to a logical '0,' thereby discontinuing the build-up of charge current in the activated charge storage circuits 716(0)-716(X) in the charge storage unit 707. The output of the charge generating circuits 714(0)-714(X) will be GND or logical "0." The output 710 of the NAND gate 712 being logical '0' will also turn off the NFET 704 in the discharge control circuit 703 leaving the wordline (WL) 506 floating. Thus, the charge stored in the charge storage circuits 716(0)-716(X) of the charge storage unit 707 will be discharged to the wordline (WL) 506. Thus, instead of the wordline (WL) 506 being driven down to GND voltage (logical '0') in this example, the wordline (WL) 506 is driven to a negative voltage below GND to strengthen the PFET access transistors 528(0), 528(1) in response to a write operation. This has the effect of positively boosting the gate-to-source voltage ($V_{GS}$) of the PFET access transistors 528(0), 528(1) to strengthen the PFET access transistors 528(0), 528(1) in response to the write operation.

As discussed in the write-assist circuit 700 in FIG. 7 above, the setup time between when the wordline enable signal 507 and the write clock signal 510 are enabled is used to provide a charge time to charge the respective charge storage circuits 716(0)-716(X). It may be desirable to provide a write-assist circuit to negatively boost the voltage of the wordline 506 of the memory bit cell 502 without the need for a setup time between when the wordline enable signal 507 and the write clock signal 510 are enabled In this regard, FIG. 8 illustrates another exemplary write-assist circuit 800 provided in a wordline driver 508B configured to negatively boost the wordline 506 of the memory bit cell 502 to strengthen the PFET access transistors 528(0), 528(1)

during a write operation to mitigate or avoid a write contention. A wordline negative boost circuit 802 in FIG. 8 includes some common components with the wordline negative boost circuit 702 in FIG. 7 indicated with common element numbers. These common elements will not be re-described with regard to FIG. 8. As discussed below, the write-assist circuit 800 includes the wordline negative boost circuit 802 to negatively boost the voltage of the wordline 506 without the need for a charge setup time. Eliminating the charge setup time will improve write operation performance.

With reference to FIG. 8, the wordline negative boost circuit 802 includes a charge path selector 803 comprising a plurality charge path selection circuits 804(0)-804(X) in this example. Before a write operation occurs, the wordline enable signal 507 is non-enabled or logical '0', and the wordline 506 is at a high or logical '1' such that the memory bit cell 502 is not enabled. Thus, the output 710 of the NAND gate 712 in the charge control circuit 709 is logical '1.' The charge generating circuits 714(0)-714(X) (AND gates in this example) are enabled by the respective programmable charge lines b(0)-b(x) and will cause voltage (Vdd) to be generated as an output to the charge storage circuits 716(0)-716(X) in the charge storage unit 707. Also, the output 710 of the NAND gate 712 in the charge control circuit 709 will be inverted by an inverter 806 in the charge path selector 803 to generate a logical '0' at a select output (SEL) 808. This will cause NFETs 810(0)-810(X) in the respective charge path selection circuits 804(0)-804(X) to be turned off such that the charge storage circuits 716(0)-716(X) are not connected to the wordline (WL) 506. Instead, the NFETs 812(0)-812(X) in the respective charge path selection circuits 804(0)-804(X) are turned on to provide a path to GND for the charge storage circuits 716(0)-716(X). This allows the charge storage circuits 716(0)-716(X) to be charged before the write operation is initiated by the wordline enable signal 507 being enabled to avoid the charge setup time in a write operation. When the wordline enable signal 507 and the write clock signal 510 are enabled, the output 710 of the NAND gate 712 in the charge control circuit 709 is logical '0.' The inverter 806 will generate a logical '1' on the select output 808 to turn off NFETs 812(0)-812(X) in the respective charge path selection circuits 804(0)-804(X) and turn on the NFETs 810(0)-810(X) in the respective charge path selection circuits 804(0)-804(X) to discharge the charge in the charge storage circuits 716(0)-716(X) to the wordline (WL) 506. Thus, the voltage of the wordline (WL) 506 is negatively boosted to strengthen the PFET access transistors 528(0), 528(1) without a charge setup time required in this example of the wordline negative boost circuit 802. However, additional area may be required to provide for the charge path selection circuits 804(0)-804(X).

It is also possible to positively boost the bitline 514 and complement bitline 514' in lieu of or in combination with negatively boosting the wordline 506 to strengthen the PFET access transistors 528(0), 528(1) in the memory bit cell 502 in response to write operations to avoid write contentions. In this regard, FIG. 9 illustrates an exemplary write-assist circuit 900 provided in a bitline driver 512A to perform a write operation in the memory bit cell 502. The write-assist circuit 900 includes a bitline positive boost circuit 902 configured to boost the voltage of the bitline 514 and complement bitline 514' of the memory bit cell 502 in FIG. 5 to increase $V_{GS}$ of the PFET access transistors 528(0), 528(1) and strengthen the PFET access transistors 528(0), 528(1) during a write operation to avoid write contentions.

Note that as discussed below, FIG. 9 shows a bitline positive boost circuit 902 configured to positively boost the complement bitline 514' in response to a write operation. However, another bitline positive boost circuit could also be provided to positively boost the bitline 514. Either the bitline 514 or complement bitline 514' is positively boosted in this example in response to a write operation. The bitline 514 or complement bitline 514' that is driven to a logical '1' value in a write operation is the bitline that is positively boosted in response to a write operation in this example.

With reference to FIG. 9, before a write operation is initiated by the write clock signal 510, the complement bitline 514' will be in a floating state. More specifically, a charge control circuit 913 is provided in the bitline positive boost circuit 902 and configured to receive the write clock signal 510. The charge control circuit 903 is configured to control a complement bitline control circuit 903 to place the complement bitline 514' in a floating state when the write clock signal 510 is not enabled outside of the write operation. This prevents a charge stored in a charge storage circuit 905 from being discharged to the complement bitline 514' outside of a write operation. However, when the write clock signal 510 is enabled (a logical low voltage level in this example) for a write operation, the charge control circuit 913 causes a charge stored in the charge storage unit 707 to be discharged to the complement bitline 514' to positively boost the voltage of the complement bitline 514' in response to a write operation. In this regard, the charge control circuit 913 generates a charge control signal 921 that causes an output 907 of a NAND gate 909 in the complement bitline control circuit 903 in this example to be logical '1,' thereby turning off a PFET 904 and an NFET 906 in the complement bitline control circuit 903 to leave the complement bitline 514' in the floating state. When the write clock signal 510 is not enabled, the charge generating circuits 714(0)-714(X) in the boost generator circuit 705 are enabled according to their respective programmable charge lines b(0)-b(x) to charge their respective charge storage circuits 716(0)-716(X) in the charge storage unit 707. Thus, when the write clock signal 510 is later enabled for a write operation and complement data 532' provided on a data input 908 to be written is logical '1,' the NFET 906 in the complement bitline control circuit 903 will be turned on, and an output 912 of an inverter 914 in the complement bitline control circuit 903 will be logical '0.' This provides for the complement bitline 514' to be set to logical '0' data.

When the write clock signal 510 is enabled and the data input 908 to be written is logical '0,' the charge control circuit 913 generates the charge control signal 921 that causes a pulse signal 915 is generated by a pulse circuit 917 on the output 912 to connect the complement bitline 514' to Vdd (logical '1' data). After the delay in a delay circuit 916 in the charge control circuit 913 expires to allow a complement data input signal 910 to be asserted onto the complement bitline 514', the propagation of the write clock signal 510 will cause the charge storage circuits 716(0)-716(X) in the charge storage unit 707 to boost the complement bitline 514'. This boosts the charge on the complement bitline 514' to increase the voltage of the complement bitline 514' to increase the strength of the PFET access transistors 528(0), 528(1).

FIG. 10 illustrates another exemplary write-assist circuit 1000 provided in a bitline driver 512B to perform a write operation on the memory bit cell 502. The write-assist circuit 1000 includes a bitline positive boost circuit 1002 configured to boost the voltage of the bitline 514 and complement bitline 514' of the memory bit cell 502 in FIG.

5 to increase the gate-to-source voltage ($V_{GS}$) of the PFET access transistors 528(0), 528(1) and strengthen the PFET access transistors 528(0), 528(1) during a write operation to avoid write contentions. Common components between the bitline driver 512B in FIG. 10 and the bitline driver 512A in FIG. 9 are shown with common element numbers in FIG. 10, and thus will not be re-described here.

With reference to FIG. 10, before a write operation is initiated by the write clock signal 510, the complement bitline 514' will be in a floating state. More specifically, when the write clock signal 510 is not enabled, the output 907 of the NAND gate 909 in the complement bitline control circuit 903' will be logical '1,' thereby turning off a PFET 904 and an NFET 906 to leave the complement bitline 514' in the floating state. In the charge storage unit 707, the charge storage circuits 716(0)-716(X) are charged when the complement data input signal 910 is a logical '1'. The charge in the charge storage circuits 716(0)-716(X) will be discharged when the complement data input signal 910 is a logical "0," because a logical '1' being asserted on the bitline 514 or complement bitline 514' is the condition when a write contention can occur. This condition exists when the complement data input signal 910 is a logical '0' in FIG. 10, because the inverter 914 inverts the complement data input signal 910 onto the complement bitline 514'.

In this regard, when the write clock signal 510 is not enabled and the complement data input signal 910 is a logical '1', the charge generating circuits 714(0)-714(X) in the boost generator circuit 705 are enabled according to their respective programmable charge lines b(0)-b(x) to charge their respective charge storage circuits 716(0)-716(X). A charge activation circuit 1005 is provided in the bitline positive boost circuit 1002 in FIG. 10. The charge activation circuit 1005 is configured to receive a discharge control signal 1009 from the complement bitline control circuit 903'. The charge activation circuit 1005 is configured to selectively couple the charge storage unit 1007 to the complement bitline 514' based on the discharge control signal 1009 to control the discharge of the charge stored in the charge storage unit 1007 onto the complement bitline 514' to positively boost the voltage on the complement bitline 514'.

In this regard, in this example, PFETs 1004(0)-1004(X) in the charge activation circuit 1005 are enabled to provide a charge path for respective charge storage circuits 716(0)-716(X) in the charge storage unit 1007 to ground (GND). PFETs 1006(0)-1006(X) in the charge activation circuit 1005 are disabled to disconnect the charge path of the charge storage circuits 716(0)-716(X) to the complement bitline 514'. When the write clock signal 510 is enabled during a write operation and the complement data input signal 910 is a logical '1', the charge generating circuits 714(0)-714(X) are still enabled according to their respective programmable charge lines b(0)-b(x) to charge their respective charge storage circuits 716(0)-716(X). Again, the PFETs 1004(0)-1004(X) in the charge activation circuit 1005 are enabled to provide a charge path of the charge storage circuits 716(0)-716(X) to ground (GND). The PFETs 1006(0)-1006(X) in the charge activation circuit 1005 are disabled to disconnect the charge path of the charge storage circuits 716(0)-716(X) to the complement bitline 514'. However, when the write clock signal 510 is enabled during a write operation and the complement data input signal 910 is a logical '0', a logical '1' is asserted onto the complement bitline 514.' In this regard, the PFETs 1004(0)-1004(X) in the charge activation circuit 1005 are disabled such that a charge path does not exist between the charge storage circuits 716(0)-716(X) and ground (GND). The PFETs 1006(0)-1006(X) in the charge activation circuit 1005 are enabled to connect the charge path of the charge storage circuits 716(0)-716(X) to the complement bitline 514' to discharge the charge stored in the charge storage circuits 716(0)-716(X) to the complement bitline 514', to provide a voltage boost to the complement bitline 514'.

Note that although the bitline positive boost circuit 1002 in FIG. 10 is shown as connected to the complement bitline 514' of the memory bit cell 502, a bitline boost circuit 1002 can also be provided and connected to the bitline 514 of the memory bit cell 502.

Note that it also possible to weaken the respective pull-down NFET 526(0) and/or 526(1) of the cross-coupled inverters 520(0) or 520(1) in the memory bit cell 502, rather than, or in addition to, negatively boosting the wordline 506 and/or positively boosting the bitline 514 or complement bitline 514' to avoid a write contention. In this regard, FIG. 11 illustrates an exemplary write-assist circuit 1100 configured to weaken the pull-down NFETs 526(0) in the cross-coupled inverter 520(0) in the memory bit cell 502 in FIG. 5 to be weaker than the respective PFET access transistor 528(0) in response to a write operation to avoid or reduce write contention. In this example, as will be discussed below, the write-assist circuit 1100 is provided in the form of a negative supply rail positive boost circuit 1102. The negative supply rail positive boost circuit 1102 is configured to positively boost a negative supply rail 1103 of the pull-down NFETs 526(0) in the cross-coupled inverter 520(0) of the storage circuit 501 of the memory bit cell 502 in this example.

Note that although the negative supply rail positive boost circuit 1102 is shown coupled to the pull-down NFET 526(0) of the inverter 520(0) in FIG. 11, the negative supply rail positive boost circuit 1102 could also be provided to be coupled to the pull-down NFET 526(1) of the inverter 520(1) in lieu of or in addition to the pull-down NFET 526(0) of inverter 520(0), if the write contention to be avoided or reduced for a write operation is also between the pull-down NFET 526(1) and the PFET access transistors 528(1).

In this regard, with reference to FIG. 11, the memory bit cell 502 is shown. The negative supply rail positive boost circuit 1102 in this example includes a voltage control circuit 1105. The voltage control circuit 1105 is configured to control the voltage provided to the negative supply rail 1103 of the storage circuit 501 based on the wordline enable signal 507 indicating if a write operation is occurring or not. In this regard, the voltage control circuit 1105 includes a first control circuit 1107. The first control circuit 1107 is configured to couple a first supply voltage (Vss) to the negative supply rail 1103 in response to the wordline enable signal 507 not indicating the write operation in this example. Thus, when the write clock signal 510 is disabled and the wordline enable signal 507 is not enabled, meaning a write operation is not occurring, an output 1102 of a NAND gate 1104 in the negative supply rail positive boost circuit 1102 will be logical '1.' This will turn on an NFET 1106 in the first control circuit 1107 in this example to be connected to ground (GND). PFETs 1108, 1110 in a second control circuit 1109 will not be activated and thus will be turned off. Thus, the pull-down NFET 526(0) in the inverter 520(0) will be connected through a node 1111 to couple the negative supply rail 1103 of inverter 520(0) to ground (GND), which will not weaken the pull-down NFET 526(0). Thus, during read operations for example, the pull-down NFET 526(0) is coupled to ground (GND).

However, in response to a write operation for the memory bit cell 502, the second control circuit 1109 provided in the voltage control circuit 1105 is configured to couple a voltage based on the second supply voltage (Vdd) to the negative supply rail 1103 in response to the wordline enable signal 507 indicating a write operation. The second supply voltage (Vdd) has a higher voltage level than the first supply voltage (Vss) in this example. Coupling a voltage based on the second supply voltage (Vdd) to the negative supply rail 1103 in response to the write operation reduces the gate-to-source voltage ($V_{GS}$) of the pull-down NFET 526(0) in the inverter 520(0) in the storage circuit 510, and weakens the pull-down NFET 526(0) during a write operation. In this regard, the write clock signal 510 is enabled causing a pulse signal 1113 to be generated from a pulse generator 1115 based on the write clock signal 510. The wordline enable signal 507 is also enabled for the write operation for the memory bit cell 502. Thus, the output 1102 of the NAND gate 1104 will be logical '0,' which will turn off the NFET 1106 such that the node 1111 is no longer coupled to ground (GND). The PFET 1108 and PFET 1110 in the second control circuit 1109 will be turned on in a voltage divider arrangement to divide voltage (Vdd) between the node 1111 and ground (GND) to provide a source voltage greater than the voltage at ground (GND) at the node 1111 and the negative supply rail 1103 of the pull-down NFET 526(0) in the inverter 520(0). This has the effect of reducing the gate-to-source voltage of the pull-down NFET 526(0) in the inverter 520(0) to weaken the pull-down NFET 526(0) in response to a write operation to avoid or reduce write contentions between the PFET access transistor 528(0) and the pull-down NFET 526(0) in this example.

The ratio of the sizes (i.e., resistances) of the PFET 1108 and PFET 1100 determines how the voltage (Vdd) will be divided among the PFET 1108 and PFET 1100, and thus the voltage at the node 1111. For example, if the PFET 1108 and PFET 1100 are the same size, the voltage (Vdd) will be approximately split in half (Vdd/2) between the PFET 1108 and PFET 1100, providing voltage (Vdd)/2 at the node 1111 to the pull-down NFETs 526(0).

FIG. 12 illustrates another exemplary write-assist circuit 1200 also configured to weaken the pull-down NFET 526(0) in the inverters 520(0) in the memory bit cell 502 in FIG. 5 to be weaker than the respective PFET access transistors 528(0) in response to a write operation to avoid or reduce a write contention. In this example, as will be discussed below, a write-assist circuit 1200 is also provided in the form of a negative supply rail positive boost circuit 1202. The negative supply rail positive boost circuit 1202 is configured to positively boost a negative supply rail 1103 of the pull-down NFETs 526(0) in the cross-coupled inverter 520 (0) of the storage circuit 501 of the memory bit cell 502 in this example. Note that although the negative supply rail positive boost circuit 1202 is shown coupled to the pull-down NFET 526(0) of the inverter 520(0) in FIG. 12, the negative supply rail positive boost circuit 1102 could also be provided to be coupled to the pull-down NFET 526(1) of the inverter 520(1), if the write contention to be avoided or reduced for a write operation is between the pull-down NFET 526(1) and the PFET access transistor 528(1). Common components between the memory bit cell 502 and write-assist circuit 1200 in FIGS. 11 and 12 are shown with common element numbers, and thus will not be re-described.

In this regard, with reference to FIG. 12, when the write clock signal 510 is disabled, the output 1102 of the NAND gate 1104 will be logical '1.' A first control circuit 1206 in a voltage control circuit 1204 is provided. The first control circuit 1206 is configured to couple the first supply voltage (VSS) to the negative supply rail 1103 in response to the wordline enable signal 507 not indicating the write operation in this example. Thus, when the write clock signal 510 is disabled and the wordline enable signal 507 is not enabled, meaning a write operation is not occurring, an output 1102 of a NAND gate 1104 in the negative supply rail positive boost circuit 1102 will be a logical '1.' This will turn on an NFET 1210 in the first control circuit 1206 in this example connected to ground (GND), to connect the node 1111 to ground (GND). Thus, the negative supply rail 1103 of the pull-down NFET 526(0) in the inverter 520(0) will be coupled through the node 1111 to ground (GND), which will not weaken the pull-down NFET 526(0) or 526(1). The PFET 1110 in a second control circuit 1208 in the voltage control circuit 1204 will not be turned on or activated.

However, when the write clock signal 510 is enabled and the wordline enable signal 507 is enabled in response to a write operation for the memory bit cell 502, the second control circuit 1208 provided in the voltage control circuit 1204 is configured to couple a voltage based on the second supply voltage (Vdd) to the negative supply rail 1103 in response to the wordline enable signal 507 indicating a write operation. The second supply voltage (Vdd) has a higher voltage level than the first supply voltage (Vss) in this example. Coupling a voltage based on the second supply voltage (Vdd) to the negative supply rail 1103 in response to the write operation reduces the gate-to-source voltage ($V_{GS}$) of the pull-down NFET 526(0) in the inverter 520(0) in the storage circuit 501, and weakens the pull-down NFET 526(0) during a write operation. In this regard, in this example, the output 1102 of the NAND gate 1104 will be logical '0,' which will turn off the NFET 1210 in the first control circuit 1206. The NFET 1210 will be turned off and the PFET 1110 in the second control circuit 1208 will be activated or turned on. Thus, voltage (Vdd) will be provided by the PFET 1110 in the second control circuit 1208 to the node 1111 and to the negative supply rail 1103 of the pull-down NFET 526(0) in the inverter 520(0). In this example, to allow the voltage provided to the node 1111 and thus the negative supply rail 1103 based on the second supply voltage (Vdd) to be variably controlled, another NFET 1212 is provided in the second control circuit 1208 in this example. The NFET 1212 is coupled to ground (GND) and is controlled by a voltage of a bias input signal (BIAS) in a voltage divider arrangement with the PFET 1110 to provide a voltage signal greater than ground (GND) to the negative supply rail 1103 of the pull-down NFET 526(0) in the inverter 520(0) to weaken the pull-down NFET 526(0). The bias input signal (BIAS) controls the resistance of the NFET 1212 and thus the amount of voltage (Vdd) divided between the PFET 1110 and the NFET 1212 at node 1111. The voltage at the node 1111 is provided to the negative supply rail 1103.

The PFET write port bit cells and write-assist circuits disclosed herein to avoid write conditions in the PFET read/write port bit cells according to aspects disclosed herein, may be provided in or integrated into a memory in any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 13:
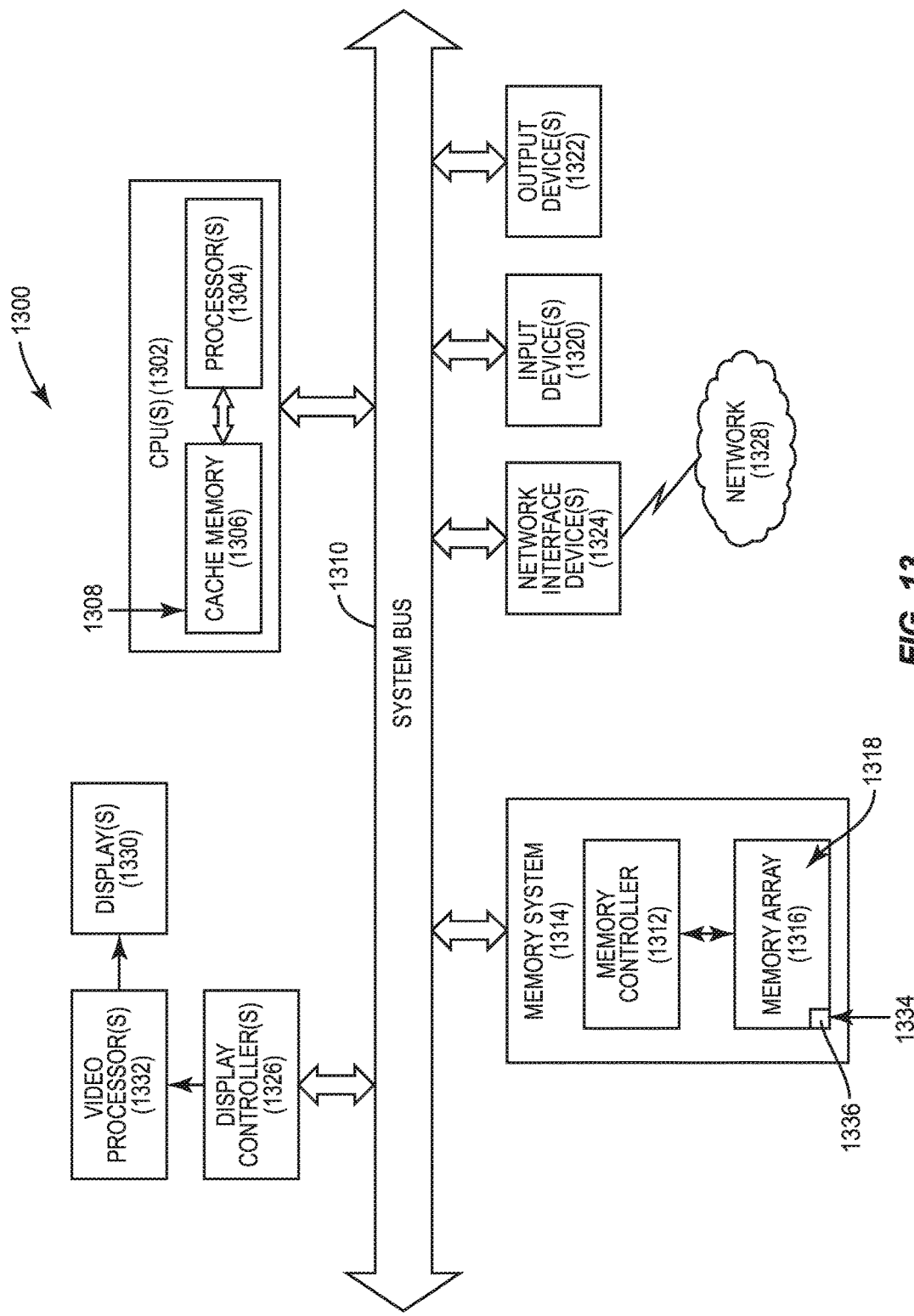
FIG. 13 is a block diagram of an exemplary processor-based system that can include memory systems that employ write-assist circuits for memory bit cells with PFET write ports, and according to any of the aspects disclosed herein.

In this regard, FIG. 13 illustrates an example of a processor-based system 1300 that can employ memory systems that include PFET write port bit cells employing write-assist circuits disclosed herein to avoid write contentions in the PFET write port bit cells according to aspects disclosed herein. In this example, the processor-based system 1300 includes one or more central processing units (CPUs) 1302, each including one or more processors 1304. The CPU(s) 1302 may have cache memory 1306 coupled to the processor(s) 1304 for rapid access to temporarily stored data. The cache memory 1306 can employ PFET write port bit cells 1308, including the PFET write port memory bit cell 502 illustrated in FIG. 5. The CPU(s) 1302 is coupled to a system bus 1310 and can intercouple master and slave devices included in the processor-based system 1300. As is well known, the CPU(s) 1302 communicates with these other devices by exchanging address, control, and data information over the system bus 1310. For example, the CPU(s) 1302 can communicate bus transaction requests to a memory controller 1312 in a memory system 1314 as an example of a slave device. Although not illustrated in FIG. 13, multiple system buses 1310 could be provided, wherein each system bus 1310 constitutes a different fabric. In this example, the memory controller 1312 is configured to provide memory access requests to a memory array 1316 in the memory system 1314. The memory array 1316 can also include PFET write port bit cells 1318 that include read assist circuits.

Other devices can be connected to the system bus 1310. As illustrated in FIG. 13, these devices can include the memory system 1314, one or more input devices 1320, one or more output devices 1322, one or more network interface devices 1324, and one or more display controllers 1326, as examples. The input device(s) 1320 can include any type of input device, including but not limited to input keys, switches, voice processors, etc. The output device(s) 1322 can include any type of output device, including but not limited to audio, video, other visual indicators, etc. The network interface device(s) 1324 can be any devices configured to allow exchange of data to and from a network 1328. The network 1328 can be any type of network, including but not limited to a wired or wireless network, a private or public network, a local area network (LAN), a wide local area network (WLAN), and the Internet. The network interface device(s) 1324 can be configured to support any type of communications protocol desired.

The CPU(s) 1302 may also be configured to access the display controller(s) 1326 over the system bus 1310 to control information sent to one or more displays 1330. The display controller(s) 1326 sends information to the display(s) 1330 to be displayed via one or more video processors 1332, which process the information to be displayed into a format suitable for the display(s) 1330. The display(s) 1330 can include any type of display, including but not limited to a cathode ray tube (CRT), a liquid crystal display (LCD), a plasma display, etc.

A non-transitory computer-readable medium, such as the memory system 1314 in FIG. 13 as a non-limiting example, may also have stored thereon computer data for an integrated circuit (IC). The computer data may be provided in the form of a library cell 1334 in a cell library in this example. The computer data, when executed, can cause the CPU 1302 to store the library cell 1334 for an IC or IC design.

In this regard, in this example, the library cell 1334 comprises a library memory bit cell 1336, which may be a library cell based on the design of any PFET write port memory bit cells discussed herein. As discussed above, the PFET write port memory bit cells comprise a memory system 1314 comprising a memory bit cell configured to store data in response to a write operation, the memory bit cell comprising one or more PFET access transistors each comprising a gate configured to be activated by a wordline in response to the write operation. The PFET write port memory bit cells also comprise a wordline negative boost circuit coupled to the wordline, the wordline negative boost circuit configured to negatively boost a voltage on the wordline to negatively boost a voltage on the gate of the one or more PFET access transistors in response to the write operation.

The library memory bit cell 1336 may be a library cell based on the design of a write port memory bit cell that comprises a memory system comprising a memory bit cell configured to store data in response to a write operation. The memory bit cell comprises one or more PFET access transistors each comprising a gate configured to be activated by a wordline in response to the write operation, and an access node configured to receive data from a bitline. The memory system also comprises a bitline positive boost circuit coupled to the bitline, the bitline positive boost circuit configured to positively boost a voltage on at least one bitline in response to the write operation.

The library memory bit cell 1336 may be a library cell based on the design of a write port memory bit cell that comprises a memory system comprising a memory bit cell configured to store data in a storage circuit in response to a write operation. The memory bit cell comprises the storage circuit, which comprises a positive supply rail and a negative supply rail, one or more inverters each comprising a pull-up PFET coupled to the positive supply rail and a pull-down NFET coupled to the negative supply rail, and one or more PFET access transistors coupled to the storage circuit and configured to pass data from at least one bitline to the storage circuit in response to activation of a wordline in the write operation. The memory system also comprises a negative supply rail positive boost circuit coupled to the negative supply rail of at least one inverter among the one or more inverters, the negative supply rail positive boost circuit configured to positively boost a voltage on the negative supply rail to weaken the pull-down NFET in the one or more inverters in the storage circuit in response to the write operation.

Note that the use of PFET and NFET in this disclosure can include PMOSFETs and NMOSFETs that are metal oxide semiconductors (MOSs). The PFETs and NFETs discussed herein can include other types of oxide layers other than metal. Also note that any of the assist circuits disclosed herein can be provided for either or both of the bitline and complement bitline of the bit cells disclosed herein.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory system, comprising:
    a memory bit cell configured to store data in response to a write operation, the memory bit cell comprising one or more P-type Field-Effect Transistor (PFET) access transistors each comprising:
        a gate configured to be activated by a wordline in response to the write operation; and
        an access node configured to receive data from a bitline; and
    a bitline positive boost circuit coupled to the bitline, the bitline positive boost circuit configured to positively boost a voltage on at least one bitline in response to the activation of the wordline to activate the gate of the one or more PFET access transistors in the write operation.

2. The memory system of claim 1, wherein:
    the one or more PFET access transistors each further comprise a source; and
    the bitline positive boost circuit is configured to positively boost a voltage across the gate and the source ($V_{GS}$) of the one or more PFET access transistors in response to the activation of the wordline in the write operation, by positively boosting the voltage on the at least one bitline.

3. The memory system of claim 1, wherein the memory bit cell further comprises:
    a storage circuit; and
    the one or more PFET access transistors coupled to the storage circuit configured to pass data from at least one bitline to the storage circuit in response to activation of the wordline in the write operation.

4. The memory system of claim 3, wherein:
    the one or more PFET access transistors comprises a first PFET access transistor coupled to the storage circuit and a second PFET access transistor coupled to the storage circuit;
    the first PFET access transistor is configured to pass first data from the bitline to the storage circuit in response to activation of the wordline in the write operation; and
    the second PFET access transistor is configured to pass second data complementary to a first voltage from a complement bitline to the storage circuit in response to activation of the wordline in the write operation.

5. The memory system of claim 4, wherein:
    the storage circuit is comprised of a storage circuit and a complement storage circuit;
    the first PFET access transistor is configured to pass the first data from the bitline to the storage circuit in response to activation of the wordline in the write operation; and
    the second PFET access transistor is configured to pass the second data complementary to the first data from the complement bitline to the complement storage circuit in response to activation of the wordline in the write operation.

6. The memory system of claim 1, wherein the bitline positive boost circuit is configured to positively boost the voltage on the bitline in response to a write clock signal indicating the write operation.

7. The memory system of claim 1, wherein the bitline positive boost circuit comprises a boost generator circuit and a charge storage circuit coupled to the boost generator circuit and the bitline;
    the charge storage circuit configured to store a charge; and
    the boost generator circuit configured to:
        generate a charge to be stored in the charge storage circuit outside of the write operation; and
        discharge the charge stored in the charge storage circuit onto the bitline to positively boost the voltage on the bitline in response to the write operation.

8. The memory system of claim 7, wherein the boost generator circuit comprises a charge control circuit configured to generate a charge control signal indicating a charge enable state or a charge disable state based on a write enable state of a write clock signal;
    wherein the boost generator circuit is configured to generate the charge to be stored in the charge storage circuit in response to the charge control signal indicating a charge enable state outside of the write operation.

9. The memory system of claim 8, wherein the boost generator circuit is configured to discharge the charge stored in the charge storage circuit onto the bitline to positively boost the voltage on the bitline, in response to the charge control signal indicating a charge disable state for the write operation.

10. The memory system of claim 8, wherein the charge control circuit comprises a delay circuit configured to receive the write clock signal and generate a clock control signal as a delayed signal of the write clock signal.

11. The memory system of claim 7, wherein the boost generator circuit is comprised of a plurality of programmable charge generating circuits each configured to selectively contribute to the charge stored in the charge storage circuit in response to a respective programmable charge signal.

12. The memory system of claim 8, wherein the bitline positive boost circuit further comprises a bitline control circuit configured to receive the write clock signal and place the bitline in a floating state when the write clock signal is not enabled outside of the write operation, for the charge stored in the charge storage circuit to not be discharged to the bitline.

13. The memory system of claim 12, wherein the bitline control circuit is further configured to assert the data on the bitline when the write clock signal is enabled for the write operation, for the charge stored in the charge storage circuit to be discharged to the bitline to positively boost the voltage of the bitline.

14. The memory system of claim 13, wherein the bitline control circuit comprises a pulse circuit configured to receive the data and generate a pulse signal on the bitline as the data based on the received data.

15. The memory system of claim 1, further comprising a plurality of memory bit cells each configured to store data in response to the write operation, each memory bit cell among the plurality of memory bit cells comprising one or more PFET access transistors each comprising a gate configured to be activated by a wordline in response to the write operation; and
   the bitline positive boost circuit coupled to one or more bitlines associated with the plurality of memory bit cells, the bitline positive boost circuit configured to positively boost a voltage on the one or more bitlines in response to activation of the wordline in the write operation.

16. The memory system of claim 15, wherein the plurality of memory bit cells are disposed in a memory bit cell row of a memory array.

17. The memory system of claim 1 provided in a processor-based system.

18. The memory system of claim 17, wherein the processor-based system is comprised of a central processing unit (CPU)-based system.

19. The memory system of claim 1 integrated into a system-on-a-chip (SoC).

20. The memory system of claim 1 integrated into a device selected from the group consisting of: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

21. A memory system, comprising:
   a means for storing data in response to a write operation, the means for storing data comprising one or more P-type Field-Effect Transistor (PFET) access transistors each comprising:
      a means for being activated by a wordline in response to the write operation; and
      a means for receiving data from a bitline in response to the write operation; and
   a means for positively boosting a voltage on the bitline in response to activation of the wordline to activate the means for being activated in the write operation.

22. A method of writing data to a memory bit cell, comprising:
   charging a bitline coupled to an access node of one or more P-type Field-Effect Transistor (PFET) access transistors in a memory bit cell with data in response to a write operation;
   activating a wordline coupled to a gate of the one or more PFET access transistors in response to the write operation to transfer the data from the access node to a storage circuit; and
   positively boosting a voltage on a bitline in response to the write operation to assist transferring the data from the access node to the storage circuit in response to activation of the wordline to activate the gate of the one or more PFET access transistors in the write operation.

23. The method of claim 22, wherein positively boosting the voltage on the bitline comprises positively boosting a voltage across the gate and a source ($V_{GS}$) of the one or more PFET access transistors in response to activation of the wordline for the write operation by positively boosting the voltage on the bitline in response to activation of the wordline in the write operation.

24. The method of claim 22, comprising passing the data from the bitline through the one or more PFET access transistors to the storage circuit in response to activating the wordline in the write operation.

25. The method of claim 24, wherein passing the data from the bitline through the one or more PFET access transistors to the storage circuit, comprises:
   passing first data from the bitline through a first PFET access transistor to the storage circuit in response to activation of the wordline in the write operation; and
   passing second data complementary to the first data from a complement bitline through a second PFET access transistor to the storage circuit in response to activation of the wordline in the write operation.

26. The memory system of claim 25, wherein:
   passing the first data comprises passing the first data from the bitline through the first PFET access transistor to a storage node in the storage circuit in response to activation of the wordline in the write operation; and
   passing the second data complementary to the first data comprises passing the second data complementary to the first data from the complement bitline through the second PFET access transistor to a complement storage node in the storage circuit in response to activation of the wordline in the write operation.

27. The method of claim 22, further comprising positively boosting the voltage on the bitline in response to a write clock signal indicating the write operation.

28. The method of claim 22, further comprising:
generating a charge to be stored in a charge storage circuit outside of the write operation; and
discharging the charge stored in the charge storage circuit onto the bitline to positively boost the voltage on the bitline in response to the write operation.

29. The method of claim 28, further comprising generating a charge control signal indicating a charge enable state or a charge disable state based on a write enable state of a write clock signal, and comprising:
generating the charge to be stored in the charge storage circuit in response to the charge control signal indicating a charge enable state outside of the write operation.

30. The method of claim 29, further comprising discharging the charge stored in the charge storage circuit onto the bitline to positively boost the voltage on the bitline, in response to the charge control signal indicating a charge disable state for the write operation.

31. The method of claim 28, further comprising selectively programming a plurality of charge storage circuits in the charge storage circuit each configured to selectively contribute to the charge stored in the charge storage circuit.

32. The method of claim 29, further comprising receiving the write clock signal and placing the bitline in a floating state when the write clock signal is not enabled outside of the write operation, to not discharge the charge stored in the charge storage circuit to the bitline.

33. The method of claim 32, further comprising asserting the data on the bitline when the write clock signal is enabled for the write operation, for the charge stored in the charge storage circuit to be discharged to the bitline to positively boost the voltage of the bitline.

34. The method of claim 33, further comprising generating a pulse signal on the bitline based on the data on a received data input.

35. A non-transitory computer-readable medium having stored thereon computer data for an integrated circuit (IC), the integrated circuit comprising:
a memory bit cell configured to store data in response to a write operation, the memory bit cell comprising one or more P-type Field-Effect Transistor (PFET) access transistors each comprising:
a gate configured to be activated by a wordline in response to the write operation; and
an access node configured to receive data from a bitline; and
a bitline positive boost circuit coupled to the bitline, the bitline positive boost circuit configured to positively boost a voltage on at least one bitline in response to the activation of the wordline to activate the gate of the one or more PFET access transistors in the write operation.

* * * * *